(12) United States Patent
    Meixner et al.

(10) Patent No.: US 10,095,479 B2
(45) Date of Patent: Oct. 9, 2018

(54) VIRTUAL IMAGE PROCESSOR INSTRUCTION SET ARCHITECTURE (ISA) AND MEMORY MODEL AND EXEMPLARY TARGET HARDWARE HAVING A TWO-DIMENSIONAL SHIFT ARRAY STRUCTURE

(71) Applicant: Google LLC, Mountain View, CA (US)

(72) Inventors: Albert Meixner, Mountain View, CA (US); Ofer Shacham, Palo Alto, CA (US); David Patterson, Kensington, CA (US); Daniel Frederic Finchelstein, Redwood City, CA (US); Qiuling Zhu, San Jose, CA (US); Jason Rupert Redgrave, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 14/694,890

(22) Filed: Apr. 23, 2015

(65) Prior Publication Data
    US 2016/0313980 A1    Oct. 27, 2016

(51) Int. Cl.
    *G06F 8/20*          (2018.01)
    *G06F 8/10*          (2018.01)
    (Continued)

(52) U.S. Cl.
    CPC .................. *G06F 8/20* (2013.01); *G06F 8/10* (2013.01); *G06F 9/3004* (2013.01); *G06T 1/20* (2013.01)

(58) Field of Classification Search
    None
    See application file for complete search history.

(56) References Cited

U.S. PATENT DOCUMENTS

| 4,445,177 A | 4/1984 | Bratt et al. |
| 4,720,871 A * | 1/1988 | Chambers ................. G06T 5/20 348/606 |

(Continued)

FOREIGN PATENT DOCUMENTS

| EP | 0293701 A2 | 12/1988 |
| JP | 2013090070 | 5/2013 |

(Continued)

OTHER PUBLICATIONS

PCT/US2016/026029, International Search Report and Written Opinion, dated Jul. 5, 2016, 12 pages.

(Continued)

*Primary Examiner* — Chat C Do
*Assistant Examiner* — Douglas M Slachta
(74) *Attorney, Agent, or Firm* — Fish & Richardson P.C.

(57) ABSTRACT

A method is described that includes instantiating, within an application software development environment, a virtual processor having an instruction set architecture and memory model that contemplate first and second regions of reserved memory. The first reserved region is to keep data of an input image array. The second reserved region is to keep data of an output image array. The method also includes simulating execution of a memory load instruction of the instruction set architecture by automatically targeting the first reserved region and identifying desired input data with first and second coordinates relative to the virtual processor's position within an orthogonal coordinate system and expressed in the instruction format of the memory load instruction.

21 Claims, 32 Drawing Sheets

(51) Int. Cl.
*G06T 1/20* (2006.01)
*G06F 9/30* (2018.01)

(56) References Cited

U.S. PATENT DOCUMENTS

| | | | |
|---|---|---|---|
| 4,835,712 A | 5/1989 | Derbin et al. | |
| 4,908,644 A * | 3/1990 | Shindo | G02B 7/365 |
| | | | 382/260 |
| 4,935,894 A | 6/1990 | Ternes et al. | |
| 5,253,308 A | 10/1993 | Johnson | |
| 5,612,693 A | 3/1997 | Craft et al. | |
| 5,751,864 A * | 5/1998 | Moriwake | G06T 11/001 |
| | | | 348/239 |
| 5,802,219 A * | 9/1998 | Farkas | G06T 1/60 |
| | | | 345/501 |
| 5,892,962 A | 4/1999 | Cloutier | |
| 6,031,573 A | 2/2000 | MacCormack et al. | |
| 6,049,859 A | 4/2000 | Gliese et al. | |
| 6,366,289 B1 | 4/2002 | Johns | |
| 6,587,158 B1 | 7/2003 | Dale et al. | |
| 6,728,862 B1 | 4/2004 | Wilson | |
| 6,745,319 B1 | 6/2004 | Balmer et al. | |
| 6,970,196 B1 | 11/2005 | Masatoshi et al. | |
| 7,010,177 B1 | 3/2006 | Mattison | |
| 7,167,890 B2 | 1/2007 | Lin et al. | |
| 7,200,287 B2 | 4/2007 | Fukuda et al. | |
| 7,286,717 B2 | 10/2007 | Nomizu | |
| 7,583,851 B2 | 9/2009 | Kudo et al. | |
| 7,941,634 B2 | 5/2011 | Georgi et al. | |
| 8,023,539 B2 * | 9/2011 | Ueno | H04B 10/504 |
| | | | 372/26 |
| 8,156,284 B2 | 4/2012 | Vorbach et al. | |
| 8,321,849 B2 * | 11/2012 | Nickolls | G06F 8/456 |
| | | | 717/146 |
| 8,436,857 B2 | 5/2013 | Twilleager | |
| 8,508,612 B2 | 8/2013 | Cote et al. | |
| 8,543,843 B1 | 9/2013 | Cheng et al. | |
| 8,650,384 B2 * | 2/2014 | Lee | G06F 9/5038 |
| | | | 712/203 |
| 8,687,223 B2 * | 4/2014 | Yamamoto | H04N 1/32358 |
| | | | 358/1.14 |
| 8,749,667 B2 | 6/2014 | Noraz et al. | |
| 8,786,614 B2 | 7/2014 | Curry et al. | |
| 8,797,323 B2 | 8/2014 | Salvi et al. | |
| 8,823,736 B2 | 9/2014 | Barringer et al. | |
| 8,970,884 B2 | 3/2015 | Tsuji et al. | |
| 8,976,195 B1 | 3/2015 | Lindholm et al. | |
| 9,256,831 B2 * | 2/2016 | van Lunteren | G06N 5/025 |
| 2003/0005365 A1 | 1/2003 | Wilson | |
| 2005/0270412 A1 * | 12/2005 | Kamon | H04N 5/235 |
| | | | 348/362 |
| 2006/0044576 A1 * | 3/2006 | Tabata | H04N 1/642 |
| | | | 358/1.9 |
| 2006/0228007 A1 * | 10/2006 | Knee | G06T 5/20 |
| | | | 382/128 |
| 2007/0047828 A1 * | 3/2007 | Ishii | G06T 3/4007 |
| | | | 382/232 |
| 2007/0080969 A1 | 4/2007 | Yamaura | |
| 2007/0156729 A1 | 7/2007 | Shaylor | |
| 2008/0111823 A1 | 5/2008 | Fan et al. | |
| 2008/0244222 A1 | 10/2008 | Supalov et al. | |
| 2008/0266302 A1 | 10/2008 | Andre et al. | |
| 2009/0002390 A1 * | 1/2009 | Kuno | H04N 1/6058 |
| | | | 345/593 |
| 2009/0228677 A1 | 9/2009 | Liege | |
| 2009/0300621 A1 | 12/2009 | Mantor et al. | |
| 2009/0317009 A1 | 12/2009 | Ren | |
| 2010/0005243 A1 * | 1/2010 | Yagi | G06F 12/0875 |
| | | | 711/126 |
| 2010/0122105 A1 | 5/2010 | Arslan et al. | |
| 2010/0182042 A1 | 7/2010 | Law et al. | |
| 2010/0188538 A1 * | 7/2010 | Sugawa | H04N 5/35572 |
| | | | 348/294 |
| 2011/0055495 A1 * | 3/2011 | Wolford | G06F 13/1694 |
| | | | 711/154 |
| 2011/0087867 A1 * | 4/2011 | Jacobson | G06F 9/30087 |
| | | | 712/244 |
| 2011/0125768 A1 * | 5/2011 | Shibao | G06F 17/30123 |
| | | | 707/756 |
| 2011/0153925 A1 | 6/2011 | Bains et al. | |
| 2012/0320070 A1 | 12/2012 | Arvo | |
| 2013/0027416 A1 | 1/2013 | Vaithianathan et al. | |
| 2013/0202051 A1 | 8/2013 | Zhou | |
| 2013/0241941 A1 * | 9/2013 | Donaldson | G06F 9/44589 |
| | | | 345/505 |
| 2013/0243329 A1 | 9/2013 | Oro Garcia et al. | |
| 2013/0314428 A1 | 11/2013 | Chen et al. | |
| 2013/0318544 A1 * | 11/2013 | Kuroda | G06F 9/54 |
| | | | 719/320 |
| 2014/0019486 A1 | 1/2014 | Majumdar | |
| 2014/0028876 A1 | 1/2014 | Mills | |
| 2014/0136816 A1 | 5/2014 | Krig | |
| 2014/0270478 A1 * | 9/2014 | Chen | G06T 3/4038 |
| | | | 382/154 |
| 2014/0282611 A1 * | 9/2014 | Campbell | H04L 49/109 |
| | | | 719/313 |
| 2015/0106596 A1 | 4/2015 | Vorbach et al. | |
| 2016/0162402 A1 * | 6/2016 | Woolley, Jr. | G06N 3/0454 |
| | | | 711/202 |
| 2016/0210720 A1 | 7/2016 | Taylor et al. | |
| 2016/0219225 A1 | 7/2016 | Zhu et al. | |

FOREIGN PATENT DOCUMENTS

| | | |
|---|---|---|
| WO | WO 9409595 A1 | 4/1994 |
| WO | WO 2007/071883 A2 | 6/2007 |

OTHER PUBLICATIONS

Dykes, et al., "Communication and Computation Patterns of Large Scale Image Convolutions on Parallel Architectures", Parallel Processing Symposium, Proceddings, Eighth International Cancun, Mexico Apr. 26-29, 1994, 6 pages.

Oosterhout, Optimized Pixel Template Image Correlator, Master Thesis, Aug. 19, 1992, 74 pages.

Dykes et al., "Communication and Computation Patterns of Large Scale Image Convolutions on Parallel Architectures," Parallel Processing Symposium, Jan. 1, 1994, 6 pages.

Zhou, Minhua, et al., "Parallel Tools in HEVC for High-Throughput Processing, Applications of Digital Processing," XXXV, Proc. of SPI, vol. 8499, (Jan. 1, 2012), pp. 1-13.

Chen et al., "CRISP: Coarse-Grained Reconfigurable Image Stream Processor for Digital Still Cameras and Camcorders," IEEE Transactions on Circuits and Systems for Video Technology, Sep. 2008, 14 pages.

Cardells-Tormo et al., "Area-efficient 2-D Shift-variant Convolvers for FPGA-based Digital Image Processing," IEEE Workshop on Signal Processing Systems Design and Implementation, Nov. 2, 2005, 5 pages.

Levinthal, "Parallel Computers for Graphics Applications", ACM, 1987, pp. 193-198.

Gupta, et al., "A VLSI Architecture for Updating Raster-Scan Displays", Computer Graphics, vol. 15, No. 3, Aug. 1981, pp. 71-78.

Henretty, et al., "A Stencil Compiler for Short-Vector SIMD Architectures", ACM, ICS'13, Jun. 10-14, 2013, Eugene, Oregon, pp. 13-24.

Spampinato, et al., "A Basic Linear Algebra Compiler", ACM, CGO'14, Feb. 15-19, 2014, Orlando Fl, pp. 23-32.

Stojanov, et al., "Abstracting Vector Architectures in Library Generators: Case Study Convolution Filters", ARRAY 14, ACM, Jun. 11, 2014, UK, pp. 14-19.

DeVito, et al., "Terra: A Multi-Stage Language for High-Performance Computing", PLDI'13, Jun. 16-22, 2013, Seattle, Washington, 11 pages.

Sedaghati, et al., "SIVEC: A Vector Instruction Extension for High Performance Stencil Computation," Parallel Architectures and Compilation Techniques, Oct. 10, 2011, 12 pages.

(56) References Cited

OTHER PUBLICATIONS

Chao et al., "Pyramid Architecture for 3840×2160 Quad Full High Definition 30 Frames/s Video Acquisition," IEEE Transactions on Circuits and Systems for Video Technology, Nov. 1, 2010, 10 pages.
Ragan-Kelley et al., "Halide: A Language and Compiler for Optimizing Parallelism, Locality, and Recomputation in Image Processing Pipelines," Jun. 16, 2013, 12 pages.
Bolotoff, Paul V., "Alpha—The History in Facts and Comments" http://alasir.com/articles/a;pha_history/alpha_21164_21164pc.html, Last modification date Apr. 22, 2007,5 pages.
Wahib et al., "Scalable Kernel Fusion for Memory-Bound GPU Applications," SC14: International Conference for High Performance Computing, Networking, Storage and Analysis, Nov. 16, 2014, 12 pages.
Yu et al., "Optimizing Data Intensive Window-based Image Processing on reconfigurable Hardware Boards," Proc. IEEE Workshop on Signal Processing System Design and Implementation, Nov. 2, 2005, 6 pages.
Adams, et al. "The Frankencamera: An Experimental Platform for Computational Photography", ACM Transactions on Graphics, vol. 29, No. 4, Article 29, Publication Jul. 2010, 12 pages.
Levinthal, et al., "Chap—A SIMD Graphics Processor", Computer Graphics, vol. 18, No. 3, Jul. 1984, pp. 77-82.
Nightingale, Edmund B., et al., "Helios: Heterogeneous Multiprocessing with Satellite Kernels," SOSP '09, Oct. 11-14, 2009, Big Sky, Montana, U.S.A., (Oct. 11, 2009), 14 pages.
Eichenberger, et al., "Optimizing Compiler for the Cell Processor" PACT, Tuesday, Sep. 20, 2005, Part 1, pp. 1-16.
Eichenberger, et al., "Optimizing Compiler for the Cell Processor" PACT, Tuesday, Sep. 20, 2005, Part 2, pp. 17-32.
Kapasi, et al. "The Imagine Stream Processor", IEEE, International Conference on Computer Design: VLSI in Computers and Processors (ICCD'02), 2002, 17 pages.
Molnar, et al., "PixelFlow: High-Speed Rendering Using Image Composition" proceedings of Siggraph 92, Computer Graphics, 26, Jul. 2, 1992, 10 pages.
S.F. Reddaway,"DAP—A Distributed Processor Array", ISCA '73 Proceedings of the First Ann. Symposium on Computer Architecture, pp. 61-65.
M.J. Duff, "CLIP 4: A Large Scale Integrated Circuit Array Parallel Processor," Proc. IEEE Intl Joint Conf. Pattern Recognition, . . . Jan. 2004, pp. 728-733.
Qadeer, et al., "Convolution Engine: Balancing Efficiency & Flexibility in Specialized Computing", ISCA '13 Tel-Aviv, Israel, ACM 2013, pp. 24-35.
Shacham, et al. "Smart Memories Polymorphic Chip Multiprocessor", Proceedings of the 46$^{th}$ Design Automation Conference (OAC), San Francisco, CA, Jul. 2009.
DeVito, et al.,"First-class Runtime Generation of High-Performance Types using Exotypes", PLDI'14, Jun. 9-11, ACM, 12 pages.
Clearspeed Whitepaper: CSX Processor Architecture, www.clearspeed.com, 2007, 16 pages.
NVIDIA, "PTX:Parallel Thread Execution ISA Version 1.4", Aug. 23, 2010, 135 pages.
Silicon Hive: "Silicon System Design of Media and Communications Applications", Jun. 13, 2007, 22 pages.
Khronos, SPIR 2.0 "Provisional Specification to Enable Compiler Innovation on Diverse Parallel Architectures", Aug. 11, 2014, 2 pages.
Arasan "Silicon Hive Announces New Image Signal Processor", Eindhoven, the Netherlands, May 16, 2006, http://www.design-reuse.com/news/13362/silicon-hive-image-signal-processor.html, 3 pages.
Hegarty, et al., "Darkroom: Compiling High-Level Image Processing Code into Hardware Pipelines", Proceedings of ACM SIGGRAPH, Jul. 2014, 11 pages.
SPIR, The SPIR Specification, Version 2.0, Revision Date Jun. 5, 2014, 40 pages.

Hanrahan, Pat, "Domain-Specific Languages for Heterogeneous GPU Computing", NVIDIA Technology Conference, Oct. 2, 2009, 30 pages.
Shacham, et al., "Rethinking Digital Design: Why Design Must Change", IEEE micro Magazine, Nov./Dec. 2010.
Goldstein, et al., "PipeRench: A Coprocessor for Streaming Multimedia Acceleration", Carnegie Mellow University, Research Showcase @CMU, Appears in the 26th Annual International Symposium on Computer Architecture, May 1999, Atlanta, Georgia, 14 pages.
Khawam, et al., "The Reconfigurable Instruction Cell Array", IEEE Transactions on Very Large Scale Integration (VLSI) Systems, vol. 16, No. 1, Jan. 2008, pp. 75-85.
"ChimeraTM: The NVIDIA Computational Photography Architecture" Whitepaper, NVIDIA Corporation 2013, 15 pages.
Barry, et al., "Always-On Vision Processing Unit for Mobile Applications", IEEE Micro, Mar./Apr. 2015, pp. 56-66.
EyeQ2TM, "Vision System on a Chip", Mobileye, Sep. 2007, 4 pages.
Horowitz, Mark, "Computing's Energy Problem: (and what we can do about it)", IEEE, International Solid-State Circuits Conference 2014, 46 pages.
"Multioutput Scaler Reference Design" Altera Corporation, Application Note AN-648-1.0, Aug. 2012, 18 pages.
Adobe Systems, "Adobe Photoshop CS6", released and on sale in May 2012. pp. 1-2.
Pelc, Oscar, "Multimedia Support in the i.MX31 and i.MX31L Applications Processors", Freescale Semiconductor, Inc., Feb. 2006, http://cache.freescale.com/files/32bit/doc/white_Paper/IMX31MULTIWP.pdf, 12 pages.
Mody, et al., "High Performance and Flexible Imaging Sub-System." In Advances in Computing, Communications and Informatics (ICACCI), 2014 International Conference, pp. 545-548. IEEE, 2014.
Van der Wal, et al., "The Acadia Vision Processor", IEEE proceedings of International Workshop on Computer Applications for Machine Perception, Sep. 2000, http://citeseerx.ist.psu.edu/viewdoc/download?doi=10.1.1.32.3830&rep=rep1&type=pdf, 10 pages.
Stein, et al., "A Computer Vision System on a Chip: A Case Study From the Automotive Domain." IEEE Computer Society Conference, p. 130, 2005.
Tanabe, et al., "Visconti: multi-VLIW image Recognition Processor Based on Configurable Processor [obstacle detection applications]", Custom Integrated Circuits Conference, IEEE, 2003, http://ieeexplore.ieee.org/document/1249387/?arnumber=1249387&tag=1.
Mandal, et al., "An Embedded Vision Engine (EVE) for Automotive Vision Processing." In Circuits and Systems (ISCAS), 2014 IEEE Symposium, pp. 49-52, IEEE, 2014.
Bushey, et al., "Flexible Function-Level Acceleration of Embedded Vision Applications Using the Pipelined Vision Processor." In Signals, Systems and Computers, 2013 Asilomar Conference, pp. 1447-1452, IEEE, 2013.
Moloney, David, "1 TOPS/W Software Programmable Media Processor." Hot Chips 23 Symposium (HCS), IEEE, Aug. 2011, 24 pages.
Moloney, et al., "Myriad 2: Eye of the Computational Vision Storm", Hot Chips 26 Symposium (HCS), IEEE, Aug. 2014, 18 pages.
Parker, Richard, "Embedding Computer Vision in Electronic Devices: How New Hardware and Software Choices Have Changed the Designer's Approach", Future Technology Magazine, pp. 22-23, Feb. 2013.
Ahn, et al., "Evaluating the Image Stream Architecture." In ACM SIGARCH Computer Architecture News, vol. 32, No. 2, IEEE Computer Society, Jun. 2004, 14 pages.
Balfour, et al., "An Energy-Efficient Processor Architecture for Embedded Systems" IEEE Computer Architecture Letters 7, No. 1 p. 29-32, May 2008.
Khailany, et al., "A Programmable 512 GOPS Stream Processor for Signal, Image, and Video Processing", IEEE Journal of Solid-State Circuits, vol. 43, No. 1, pp. 202-213, Jan. 2008.
Olofsson, et al., "A 25 GFLOPS/Watt Software Programmable Floating Point Accelerator" High Performance Embedded Computing Conference, 2010, 2 pages.

(56) References Cited

OTHER PUBLICATIONS

De Dinechin, et al., "A Clustered Manycore Processor Architecture for Embedded and Accelerated Applications." In High Performance Extreme Computing Conference (HPEC), IEEE, pp. 1-6, Sep. 2013.
Codrescu, et al., "Hexagon DSP: An Architecture Optimized for Mobile Multimedia and Communications." IEEE Micro vol. 34, Issue 2, pp. 34-43, Mar. 2014.
Pham, et al., "Neu Flow: Dataflow Vision Processing System-On-A-Chip." IEEE 55th International Midwest Symposium, Aug. 2012, 4 pages.
Farabet, et al., "Neuflow: A Runtime Reconfigurable Dataflow Processor for Vision." IEEE Computer Society Conference, pp. 109-116, Jun. 2011.
Farabet, et al., "Hardware Accelerated Convolutional Neural Networks for Synthetic Vision Systems." Proceedings of 2010 IEEE International Symposium, pp. 257-260, Jun. 2010.
Chen, et al., "DaDianNao: A Machine-Learning Supercomputer." 47th Annual IEEE/ACM International Symposium, pp. 609-622, IEEE, Dec. 2014.
CEVA-MM3101: An Imaging-Optimized DSP Core Swings for an Embedded Vision Home Run, http://www.bdti.com/InsideDSP/2012/01/24/CEVA, Jan. 19, 2012, 3 pages.
Stream Processors, Inc., Company History—Foundational Work in Stream Processing initiated in 1995, https://en.wikipedia.org/wiki/Stream_Processors,_Inc, 5 pages.
Gentile, et al., "Image Processing Chain for Digital Still Cameras Based on SIMPil Architecture." ICCP International Conference Workshops, pp. 215-222, IEEE, Jun. 2005.
Hameed, et al., "Understanding Sources of Inefficiency in General-Purpose Chips." ACM SIGARCH Computer Architecture News, vol. 38, No. 3, pp. 37-47, 2010.
Galal, et al., "FPU Generator for Design Space Exploration." 21st IEEE Symposium on Computer Arithmetic (ARITH), Apr. 2013, 10 pages.
Daily, William J., "Computer architecture is all about interconnect." Proceedings of 8th International Symposium High-Perf. Comp. Architecture, Feb. 2002, 11 pages.
Chenyun, et al., "A Paradigm Shift in Local Interconnect Technology Design in the Era of Nanoscale Multigate and Gate-All-Around Devices," IEEE Electron Device Letters, vol. 36, No. 3, pp. 274-26, Mar. 2015.
SCP2200: Image Cognition Processors, https://www.element14.com/community/docs/DOC-50984/1/scp2200-image-cognition-processors, Oct. 25, 2012, 2 pages.
SCP2200: Image Cognition Processors Family [Product Brief], https://www.element14.com/community/docs/DOC-50990, Oct. 26, 2012, 2 pages.
Stream Processors, Inc. Announces Storm-1 Family of Data-Parallel Digital Signal Processors, ISSCC 2007, Feb. 12, 2007, 3 pages. http://www.businesswire.com/news/home/20070212005230/en/Stream-Processors-Announces-Storm-1-Family-Data-Parallel-Digital.
NVIDIA—NVIDIA's Next Generation CUDA™ Compute Architecture: Kepler™,GK110/210, 2014, 23 pages, 23 pages, http://international.download.nvidia.com/pdf/kepler/NVIDIA-Kepler-GK110-GK210-Architecture-Whitepaper.pdf.
MPPA—MANYCORE, Product Family Overview http://www.kairay.eu/IMG/pdf/FLYER_MPPA_MANYCORE-4.pdf, Feb. 2014, 2 pages.
McIntosh-Smith, "A Next-Generation Many-Core Processor With Reliability, Fault Tolerance and Adaptive Power Management Features Optimized for Embedded and High Performance Computing Applications" in Proceedings of the High Performance Embedded Computing Conference (HPEC) 2008, pp. 1-2, 5.
SemiWiki.com—New CEVA-ZM4 Vision IP Does Point clouds and and More: Published Feb. 27, 2015, https://www.semiwiki.com/forum/content/4354-new-ceva-xm4-vision-ip-does-point-clouds-more.html.
Shacham, Ofer, "Chip Multiprocessor Generator: Automatic Generation of Custom and Heterogeneous Complete Platforms" Dissertation—Stanford University, May 2011, 190 pages. Part 1.
Shacham, Ofer, "Chip Multiprocessor Generator: Automatic Generation of Custom and Heterogeneous Complete Platforms" Dissertation—Stanford University, May 2011, 190 pages. Part 2.
NVIDIA Tegra K1—A New Era in Mobile Computing—Whitepapers—Jan. 2014, 26 pages.
NVIDIA Tegra X1—NVIDIA's New Mobile Superchip—Whitepapers—Jan. 2015, 41 pages.
International Preliminary Report on Patentability issued in International Application No. PCT/US2016/026029, dated Nov. 2, 2017, 9 pages.

* cited by examiner

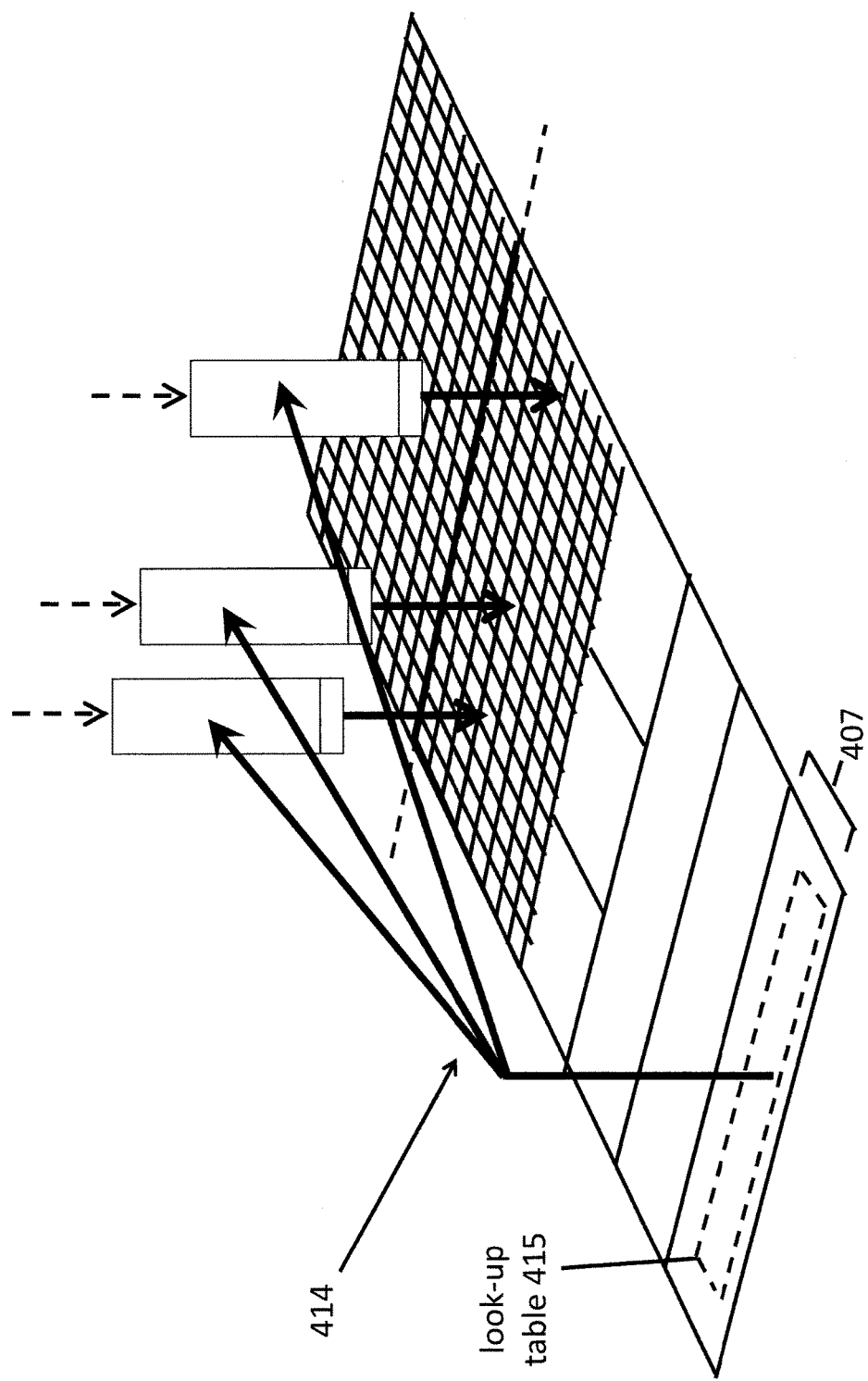

```
R1 <= LOAD BUFFER_1[(X-1);(Y);0] // read left neighbor of X, Y location from BUFFER_1 in input array
R2 <= LOAD BUFFER_1[(X);(Y);0] // read from X,Y location of BUFFER_1 in input array;
R3 <= LOAD BUFFER_1[(X+1);(Y);0] // read right neighbor of X,Y location from BUFFER_1 in input array
R2 <= ADD R1, R2
R2 <= ADD R2, R3
R2 <= DIV R2, 3   // calculate average of three pixels
STORE BUFFER_1[(X);(Y);(0)]; R2 // write contents of R2 into X, Y location of BUFFER_1 in output array
```

VIRTUAL IMAGE PROCESSOR INSTRUCTION SET ARCHITECTURE (ISA) AND MEMORY MODEL AND EXEMPLARY TARGET HARDWARE HAVING A TWO-DIMENSIONAL SHIFT ARRAY STRUCTURE

FIELD OF INVENTION

The field of invention pertains generally to image processing, and, more specifically, to a virtual image processing instruction set architecture (ISA) and memory model and exemplary target hardware having a two-dimensional shift array structure.

BACKGROUND

Image processing typically involves the processing of pixel values that are organized into an array. Here, a spatially organized two dimensional array captures the two dimensional nature of images (additional dimensions may include time (e.g., a sequence of two dimensional images) and data type (e.g., colors). In a typical scenario, the arrayed pixel values are provided by a camera that has generated a still image or a sequence of frames to capture images of motion. Traditional image processors typically fall on either side of two extremes.

A first extreme performs image processing tasks as software programs executing on a general purpose processor or general purpose-like processor (e.g., a general purpose processor with vector instruction enhancements). Although the first extreme typically provides a highly versatile application software development platform, its use of finer grained data structures combined with the associated overhead (e.g., instruction fetch and decode, handling of on-chip and off-chip data, speculative execution) ultimately results in larger amounts of energy being consumed per unit of data during execution of the program code.

A second, opposite extreme applies fixed function hardwired circuitry to much larger blocks of data. The use of larger (as opposed to finer grained) blocks of data applied directly to custom designed circuits greatly reduces power consumption per unit of data. However, the use of custom designed fixed function circuitry generally results in a limited set of tasks that the processor is able to perform. As such, the widely versatile programming environment (that is associated with the first extreme) is lacking in the second extreme.

A technology platform that provides for both highly versatile application software development opportunities combined with improved power efficiency per unit of data remains a desirable yet missing solution.

SUMMARY

A method is described that includes instantiating, within an application software development environment, a virtual processor having an instruction set architecture and memory model that contemplate first and second regions of reserved memory. The first reserved region is to keep data of an input image array. The second reserved region is to keep data of an output image array. The method also includes simulating execution of a memory load instruction of the instruction set architecture by automatically targeting the first reserved region and identifying desired input data with first and second coordinates relative to the virtual processor's position within an orthogonal coordinate system and expressed in the instruction format of the memory load instruction.

LIST OF FIGURES

The following description and accompanying drawings are used to illustrate embodiments of the invention. In the drawings:

FIGS. 4a, 4b and 4c depict various aspects of a virtual processor's memory model for developing kernel threads in a higher level application software development environment;

FIG. 5a shows an embodiment of a thread written with load instructions having a position relative format;

DETAILED DESCRIPTION i. Introduction

The description below describes numerous embodiments concerning a new image processing technology platform that provides a widely versatile application software development environment that can target a hardware architecture that uses larger blocks of data (e.g., line buffers and sheets as described further below) to provide for improved power efficiency.

Figure 1:
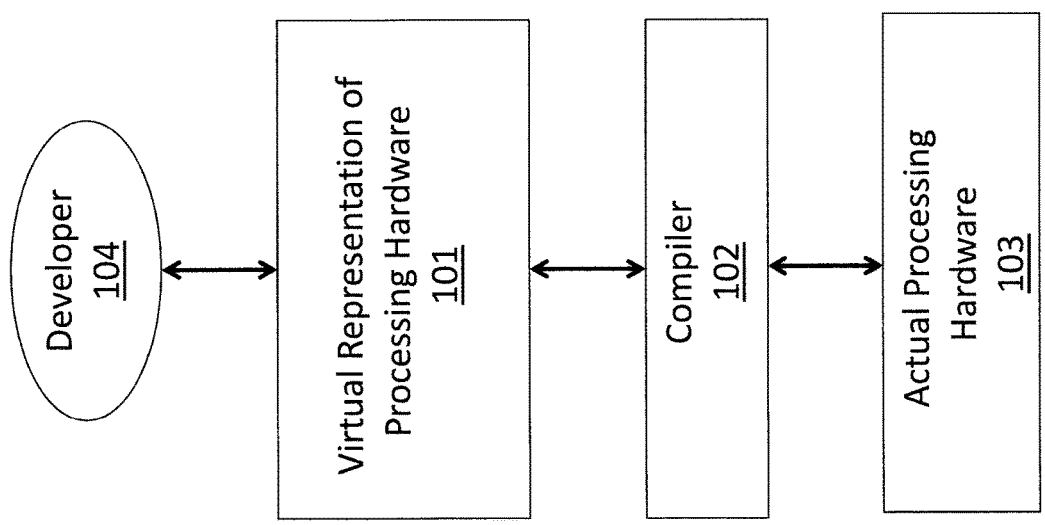
FIG. 1 shows various components of a technology platform.

1.0 Application Software Development Environment a. Application and Structure of Kernels FIG. 1 shows a high level view of an image processor technology platform that includes a virtual image processing environment 101, the actual image processing hardware 103 and a compiler 102 for translating higher level code written for the virtual processing environment 101 to object code that the actual hardware 103 physically executes. As described in more detail below, the virtual processing environment 101 is widely versatile in terms of the applications that can be developed and is tailored for easy visualization of an application's constituent processes. Upon completion of the program code development effort by the developer 104, the compiler 102 translates the code that was written within the virtual processing environment 101 into object code that is targeted for the actual hardware 103.

Figure 2A:
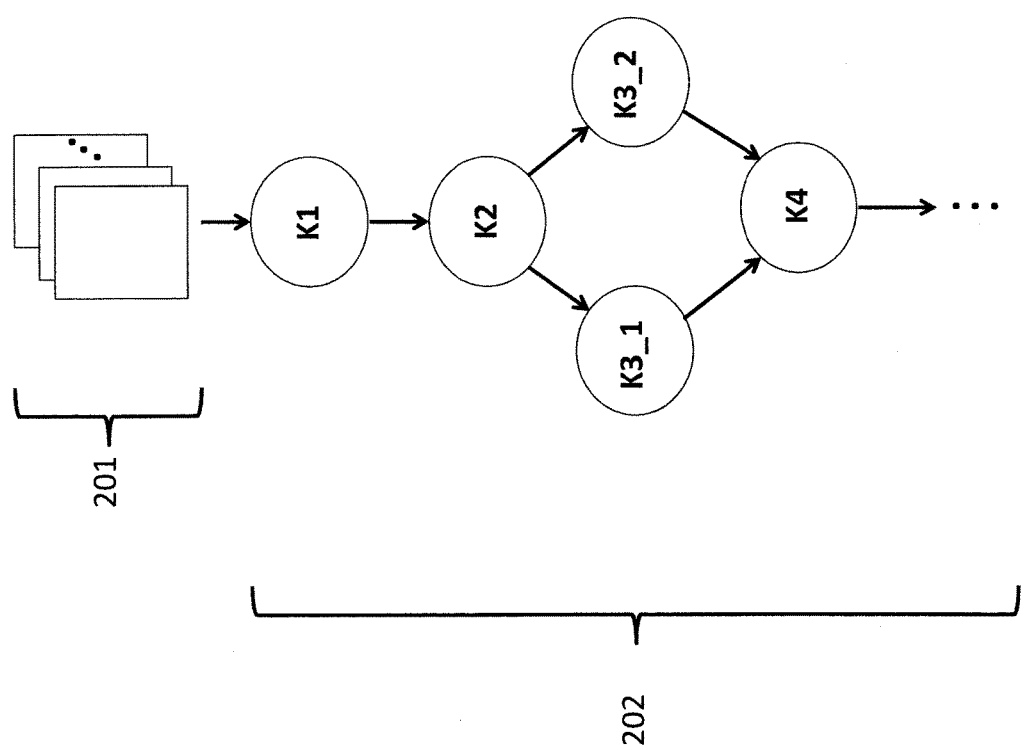
FIG. 2a shows an embodiment of application software built with kernels.

FIG. 2a shows an example of the structure and form that application software written within the virtual environment may take. As observed in FIG. 2a, the program code may be expected to process one or more frames of input image data 201 to effect some overall transformation on the input image data 201. The transformation is realized with the operation of one or more kernels of program code 202 that operate on the input image data in an orchestrated sequence articulated by the developer.

For example, as observed in FIG. 2a, the overall transformation is effected by first processing each input image with a first kernel K1. The output images produced by kernel K1 are then operated on by kernel K2. Each of the output images produced by kernel K2 are then operated on by kernel K3_1 or K3_2, The output images produced by kernel(s) K3_1/K3_2 are then operated on by kernel K4. Kernels K3_1 and K3_2 may be identical kernels designed to speed-up the overall processing by imposing parallel processing at the K3 stage, or, may be different kernels (e.g., kernel K3_1 operates on input images of a first specific type and kernel K3_2 operates on input images of a second, different type).

As such, the larger overall image processing sequence may take the form of a image processing pipeline or a directed acyclic graph (DAG) and the development environment may be equipped to actually present the developer with a representation of the program code being developed as such. Kernels may be developed by a developer individually and/or may be provided by an entity that supplies any underlying technology (such as the actual signal processor hardware and/or a design thereof) and/or by a third party (e.g., a vendor of kernel software written for the development environment). As such, it is expected that a nominal development environment will include a "library" of kernels that developers are free to "hook-up" in various ways to effect the overall flow of their larger development effort. Some basic kernels that are expected to be part of such a library may include kernels to provide any one or more of the following basic image processing tasks: convolutions, denoising, color space conversions, edge and corner detection, sharpening, white balance, gamma correction, tone mapping, matrix multiply, image registration, pyramid construction, wavelet transformation, block-wise discrete cosine and Fourier transformations.

Figure 2B:
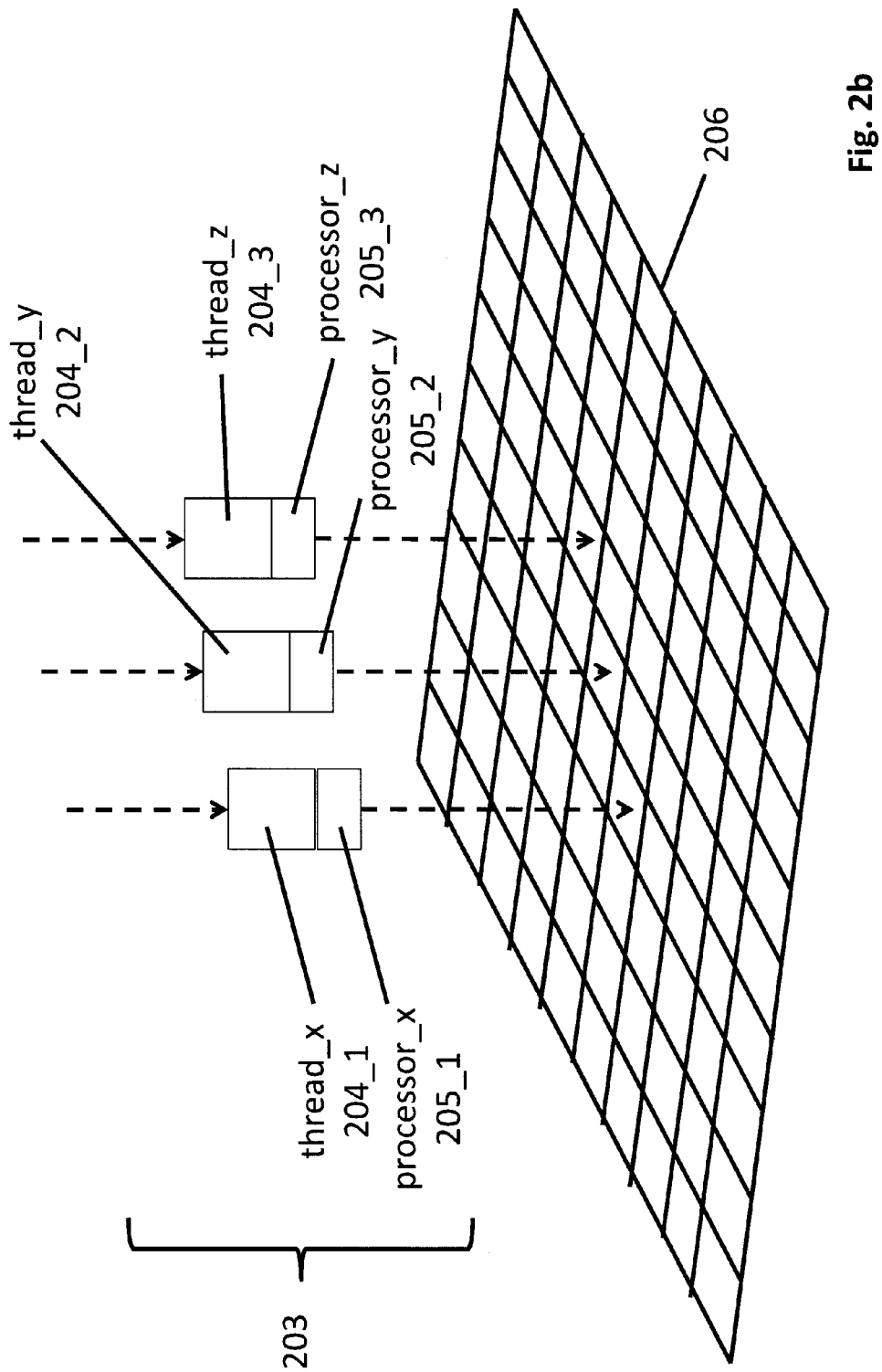
FIG. 2b shows an embodiment of the structure of a kernel.

FIG. 2b shows an exemplary depiction of the structure of a kernel 203 as may be envisioned by a developer. As observed in FIG. 2b, the kernel 203 can be viewed as a number of parallel threads of program code ("threads") 204 that are each operating on a respective underlying processor 205 where each processor 205 is directed to a particular location in an output array 206 (such as a specific pixel location in the output image that the kernel is generating). For simplicity only three processors and corresponding threads are shown in FIG. 2b. In various embodiments, every depicted output array location would have its own dedicated processor and corresponding thread. That is, a separate processor and thread can be allocated for each pixel in the output array. In alternative approaches, a same thread may generate data for more than output pixel and/or two different threads (e.g., in certain limited cases) may collaborate on the generation of the data for a same output pixel.

As will be described in more detail below, in various embodiments, in the actual underlying hardware an array of execution lanes and corresponding threads operate in unison (e.g., in a Single Instruction Multiple Data (SIMD) like fashion) to generate output image data for a portion of a "line group" of the frame currently being processed. A line group is a contiguous, sizable section of an image frame. In various embodiments, the developer may be conscious the hardware operates on line groups, or, the development environment may present an abstraction in which there is a separate processor and thread for, e.g., every pixel in the output frame (e.g., every pixel in an output frame generated by its own dedicated processor and thread). Regardless, in various embodiments, the developer understands the kernel to include an individual thread for each output pixel (whether the output array is visualized is an entire output frame or a section thereof).

As will be described in more detail below, in an embodiment the processors 205 that are presented to the developer in the virtual environment have an instruction set architecture (ISA) that, not only supports standard (e.g., RISC) opcodes, but also include specially formatted data access instructions that permit the developer to easily visualize the pixel by pixel processing that is being performed. The ability to easily define/visualize any input array location in combination with an entire ISA of traditional mathematical and program control opcodes allows for an extremely versatile programming environment that essentially permits an application program developer to define, ideally, any desired function to be performed on any sized image surface. For example, ideally, any mathematical operation can be readily programmed to be applied to any stencil size.

With respect to the data access instructions, in an embodiment the ISA of the virtual processors ("virtual ISA") include a special data load instruction and a special data store instruction. The data load instruction is able to read from any location within an input array of image data. The data store instruction is able to write to any location within the output array of image data. The latter instruction allows for easily dedicating multiple instances of the same processor to different output pixel locations (each processor writes to a different pixel in the output array). As such, for example, stencil size itself (e.g., expressed as a width of pixels and a height of pixels) can be made an easily programmable feature. Visualization of the processing operations is further simplified with each of the special load and store instructions having a special instruction format whereby target array locations are specified simplistically as X and Y coordinates.

Regardless, by instantiating a separate processor for each of multiple locations in the output array, the processors can execute their respective threads in parallel so that, e.g., the respective values for all locations in the output array are produced concurrently. It is noteworthy that many image processing routines typically perform the same operations on different pixels of the same output image. As such, in one embodiment of the development environment, each processor is presumed to be identical and executes the same thread program code. Thus, the virtualized environment can be viewed as a type of two-dimensional (2D), SIMD processor composed of a 2D array of, e.g., identical processors each executing identical code in lock-step.

Figure 3:
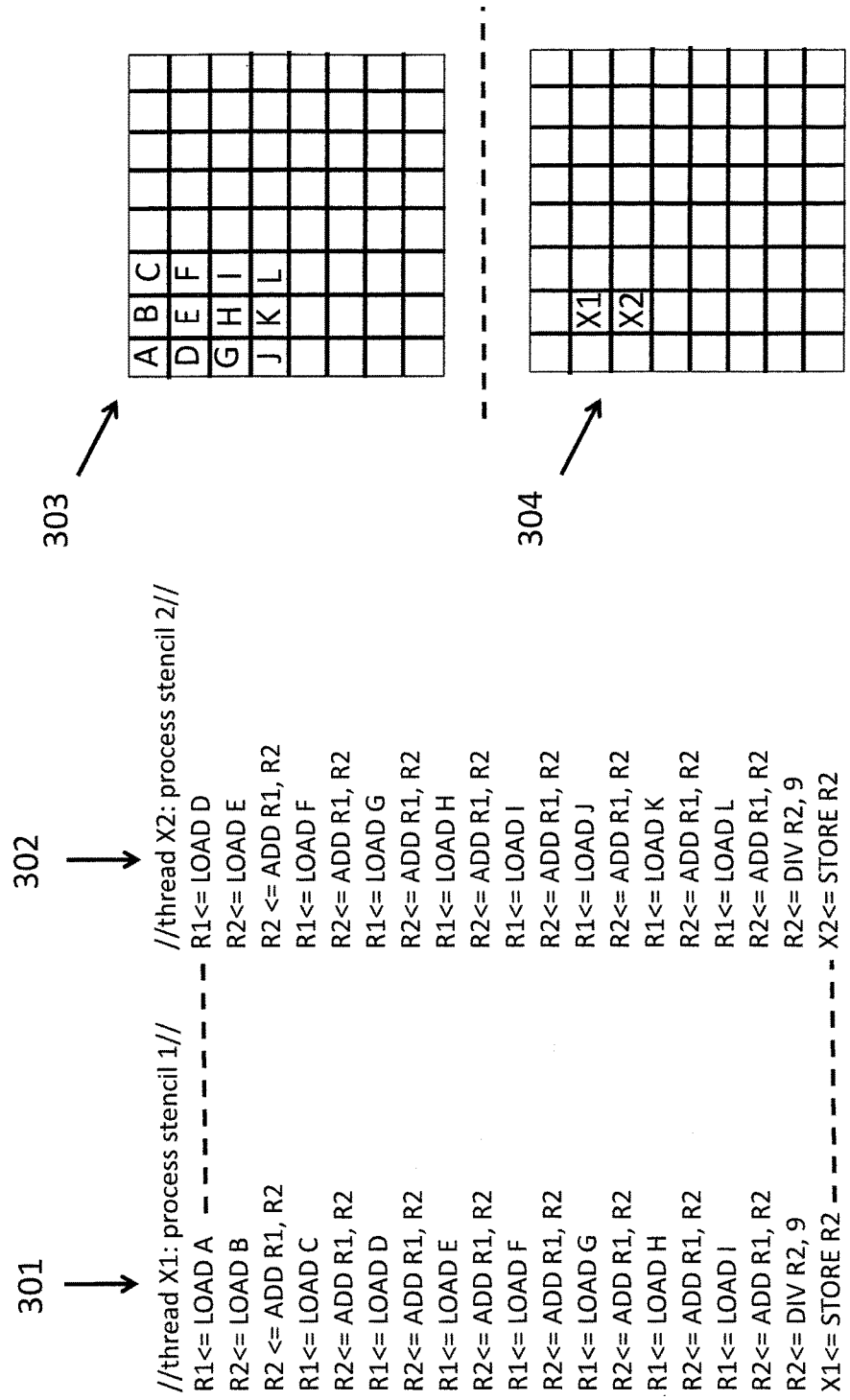
FIG. 3 shows an embodiment of the operation of a kernel.

FIG. 3 shows a more detailed example of the processing environment for two virtual processors that are processing identical code for two different pixel locations in an output array. FIG. 3 shows an output array 304 that corresponds to an output image being generated. Here, a first virtual processor is processing the code of thread 301 to generate an output value at location X1 of the output array 304 and a second virtual processor is processing the code of thread 302 to generate an output value at location X2 of the output array 304. Again, in various embodiments, the developer would understand there is a separate processor and thread for each pixel location in the output array 304 (for simplicity FIG. 3 only shows two of them). However, the developer in various embodiments need only develop code for one processor and thread (because of the SIMD like nature of the machine).

As is known in the art, an output pixel value is often determined by processing the pixels of an input array that include and surround the corresponding output pixel location. For example, as can be seen from FIG. 3, position X1 of the output array 304 corresponds to position E of the input array 303. The stencil of input array 303 pixel values that would be processed to determine output value X1 would therefore corresponds to input values ABCDEFGHI. Similarly, the stencil of input array pixels that would be processed to determine output value X2 would corresponds to input values DEFGHIJKL.

FIG. 3 shows an example of corresponding virtual environment program code for a pair of threads 301, 302 that could be used to calculate output values X1 and X2, respectively. In the example of FIG. 3 both pairs of code are identical and average a stencil of nine input array values to determine a corresponding output value. The only difference between the two threads is the variables that are called up from the input array and the location of the output array that is written to. Specifically, the thread that writes to output location X1 operates on stencil ABCDEFGHI and the thread that writes to output location X2 operates on stencil DEFGHIJKL.

As can be seen from the respective program code from the pair of threads 301, 302, each virtual processor at least includes internal registers R1 and R2 and at least supports the following instructions: 1) a LOAD instruction from the input array into R1; 2) a LOAD instruction from the input array into R2; 3) an ADD instruction that adds the contents of R1 and R2 and places the resultant in R2; 4) a DIV instruction that divides the value within R2 by immediate operand 9; and, 5) a STORE instruction the stores the contents of R2 into the output array location that the thread is dedicated to. Again, although only two output array locations and only two threads and corresponding processors are depicted in FIG. 3, conceivably, every location in the output array could be assigned a virtual processor and corresponding thread that performs these functions. In various embodiments, in keeping with the SIMD-like nature of the processing environment, the multiple threads execute in isolation of one another. That is, there is no thread-to-thread communication between virtual processors (one SIMD channel is preventing from crossing into another SIMD channel).

b. Virtual Processor Memory Model

Figure 4A:
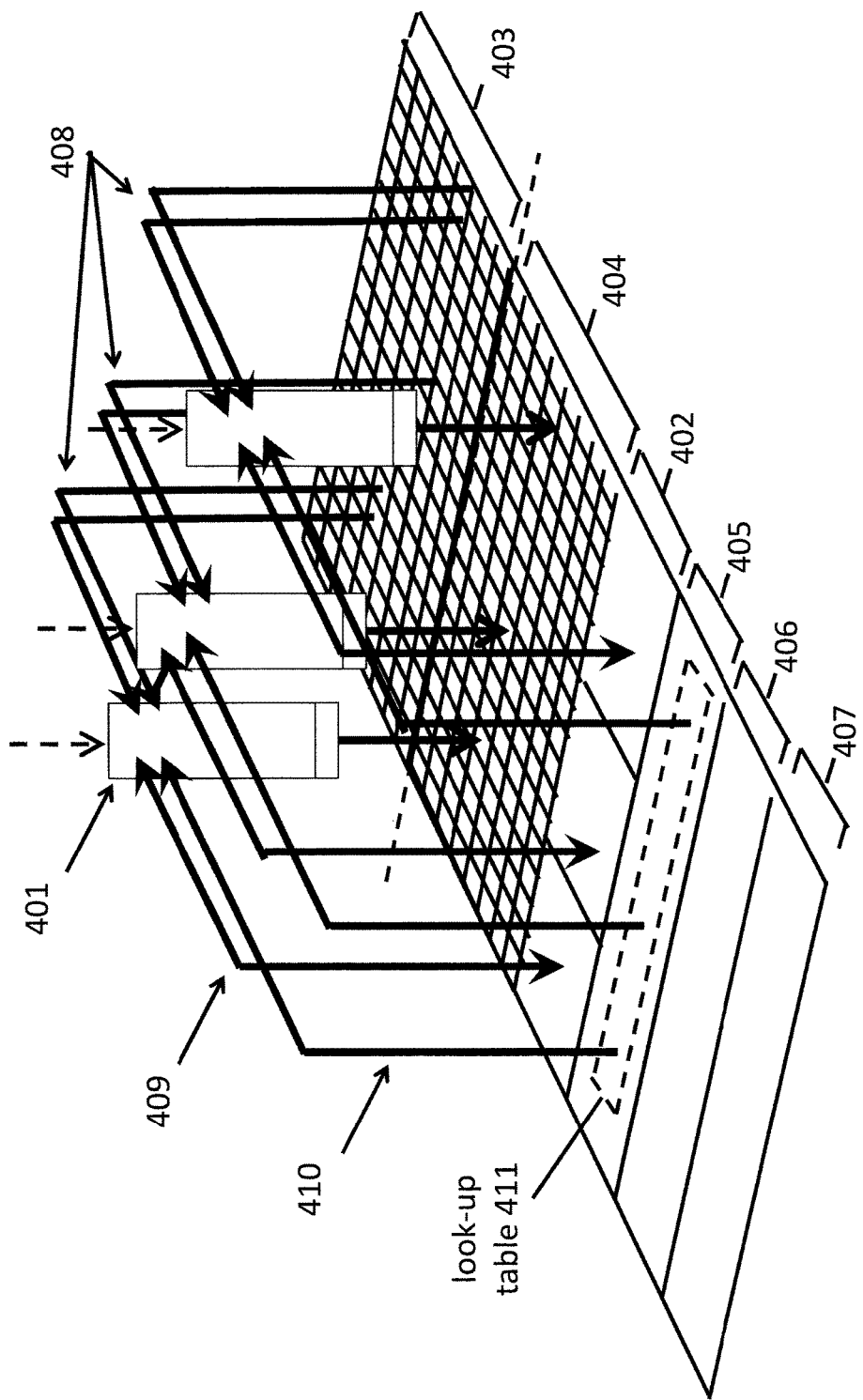
Figure 4B:
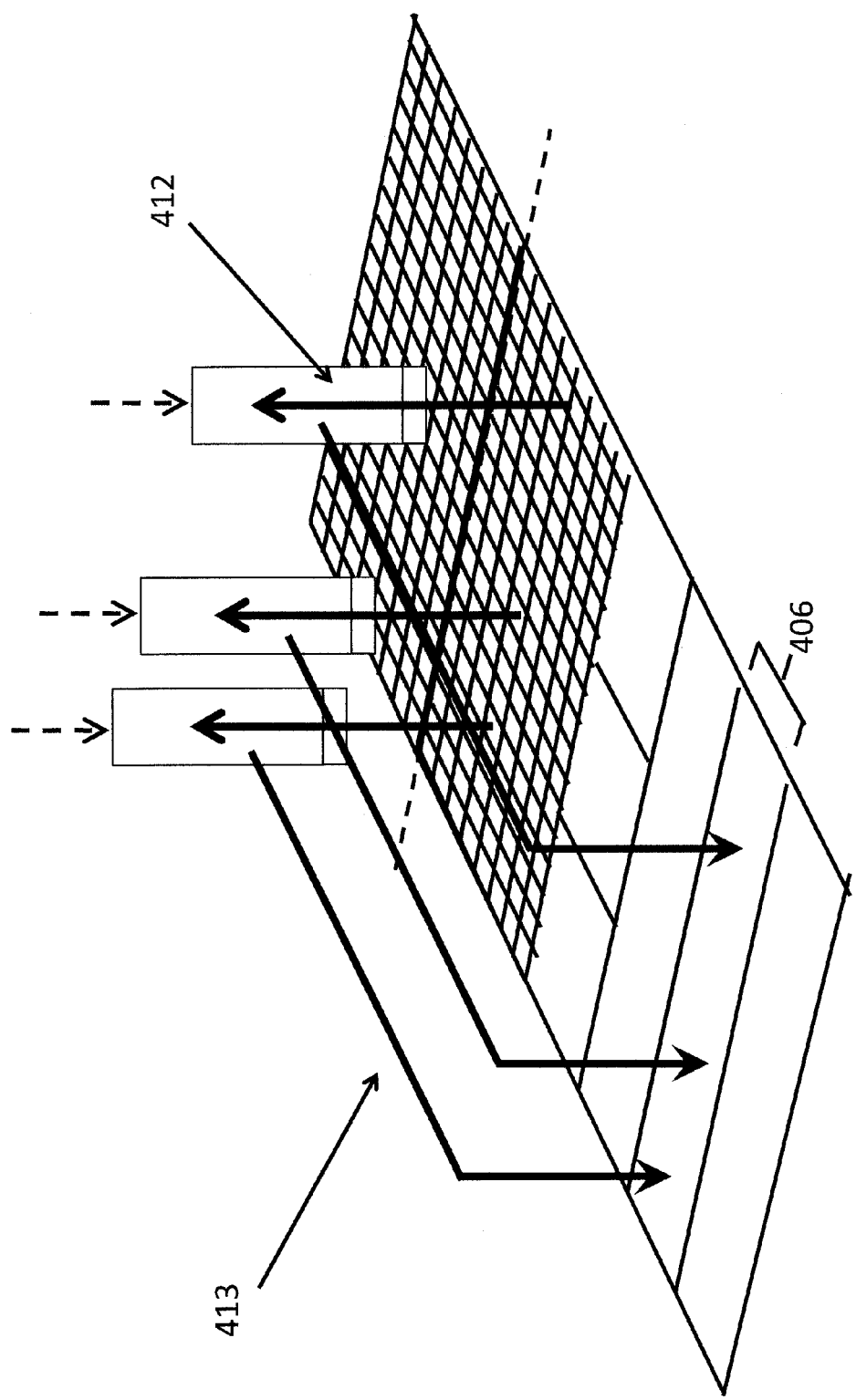

In various embodiments, a pertinent feature of the virtual processors is their memory model. As is understood in the art, a processor reads data from memory, operates on that data and writes new data back into memory. A memory model is the perspective or view that a processor has of the manner in which data is organized in memory. FIGS. 4a-4c pertain to an embodiment of the memory model for the virtual processors of the development environment. A simplistic environment involving only three virtual processors and corresponding threads 401 is used for purposes of example. As will be described in more detail below, the memory model of the virtual processors takes care to preserve SIMD semantics while, at the same time, provide for scalar operations and private intermediate value storage space for each virtual processor.

As observed in FIG. 4a, in an embodiment, the memory region that each virtual processor operates out of is organized into six different partitions based on the type of information that is stored. Specifically, there exists: 1) a private scratchpad region 402; 2) a global input data array region 403; 3) a global output data array region 404; 4) a global look-up table information region 405; 5) a global atomic statistics region 406; and, 6) a global constant table information region 407.

The partitions as depicted in FIG. 4a attempt to visualize those regions of memory that are shared or "global" amongst virtual processors in keeping with the SIMD-like nature of the overall processing environment. Likewise, FIG. 4a also attempts to visualize other regions of memory that are not shared amongst virtual processors or are "private" to a particular virtual processor. Specifically, as observed in FIG. 4a, all of the memory partitions are global with the exception of a scratchpad region 402 that is private to each virtual processor. A number of the different memory regions also have different memory addressing schemes as described further below.

With respect to the scratch pad region 402, it is not uncommon to temporarily store intermediate information over the course of execution of a sophisticated image processing algorithm (e.g., and then read the information back and use it a later time). Additionally, it is not uncommon for such information to be different across threads (different input values may effect different intermediate values). The memory model therefore includes per processor private scratchpad regions 402 for the storage of such intermediate information by each virtual processor's corresponding thread. In an embodiment, the scratch pad region for a particular processor is accessed 409 by that processor through a typical (e.g., linear) random access memory address and is a read/write region of memory (i.e., a virtual processor is able to both read information from private memory as well as write information into private memory). Embodiments of the virtual processor ISA instruction formal for accessing the scratchpad region are discussed in more detail further below.

The input array portion 403 contains the set of input data that is called into 408 the set of threads in order to produce output data. In a typical situation the input array corresponds to an image (e.g., a frame) or section of an image that each thread is operating on or within. The input image may be a true input such as the pixel information provided by a camera, or, some form of intermediate image such as the information provided by a previous kernel in a larger overall image processing sequence. Virtual processors typically do not compete for same input data items because they operate on different pixel locations of the input image data during a same cycle.

In an embodiment, a novel memory addressing scheme is used to define which particular input values are to be called in from the input array 403. Specifically, a "position relative" addressing scheme is used that defines the desired input data with X, Y coordinates rather than a traditional linear memory address. As such, the load instruction of the virtual processors' ISA includes an instruction format that identifies a specific memory location within the input array with an X component and a Y component. As such, a two-dimensional coordinate system is used to address memory for input values read from the input array 403.

The use of a position relative memory addressing approach permits the region of an image that a virtual processor is operating on to be more readily identifiable to a developer. As mentioned above, the ability to easily define/visualize any input array location in combination with an entire ISA of traditional mathematical and program control opcodes allows for an extremely versatile programming environment that essentially permits an application program developer to readily define, ideally, any desired function to be performed on any sized image surface. Various instruction format embodiments for instructions that adopt a position relative addressing scheme, as well as embodiments of other features of the supported ISA, are described in more detail further below.

The output array 404 contains the output image data that the threads are responsible for generating. The output image data may be final image data such as the actual image data that is presented on a display that follows the overall image processing sequence, or, may be intermediate image data that a subsequent kernel of the overall image processing sequence uses as its input image data information. Again, typically virtual processors do not compete for same output data items because they write to different pixel locations of the output image data during a same cycle.

In an embodiment, the position relative addressing scheme is also used for writes to the output array. As such, the ISA for each virtual processor includes a store instruction whose instruction format defines a targeted write location in memory as a two-dimensional X, Y coordinate rather than a traditional random access memory address. More details concerning embodiments of the position relative instructions of the virtual ISA are provided further below.

FIG. 4a also shows each virtual processor performing a look-up 410 into a look-up table 411 that is kept within the look-up table memory region 405. Look-up tables are often used by image processing tasks to, e.g., obtain filter or transform coefficients for different array locations, implement complex functions (e.g., gamma curves, sine, cosine) where the look-up table provides the function output for an input index value, etc. Here, it is expected that SIMD image processing sequences will often perform a look-up into a same look-up table during a same clock cycle. As such, like the input and output array memory regions 403, 404, the look-up table region 405 is globally accessible by any virtual processor. FIG. 4a likewise shows each of the three virtual processors effectively looking-up information from a same look-up table 411 kept in the look-up table memory region 405.

In an embodiment, as index values are typically used to define a desired look-up table entry, the look-up table information region is accessed using a normal linear accessing scheme. In an embodiment the look-up region of memory is read only (i.e., the processor can not change information in a look-up table and is only permitted to read information from it). For simplicity FIG. 4a suggests only one look-up table is resident within the look-up table region 405 but the virtual environment permits for multiple, different look-up tables to be resident during the simulated runtime. Embodiments of the virtual ISA instruction format for instructions that perform look-ups into the look-up table are provided further below.

FIG. 4b shows each of the three virtual processors writing 413 to the atomic statistics region 406. It is not uncommon for image processes to "update" or make a modest change to output information. The updated information may then be used for other downstream processes that make use of the updated information. Examples of such updates or modest changes include simple additions of a fixed offset to output data, simple multiplication of a multiplicand against output data, or minimum or maximum comparisons of output data against some threshold.

In these sequences, as observed in FIG. 4b, output data that has just been calculated by the individual threads may be operated upon and the resultants written to the atomic statistics region 406. Depending on implementation semantics, the output data that is operated on by an atomic act may be kept internally by the processor or called up from the output array, FIG. 4b shows the later 412. In various embodiments, the atomic acts that may be performed on the output data include add, multiply, min and max. In an embodiment, the atomic statistics region 406 is accessed using a position relative addressing scheme (as with input and output array accesses) given that updates to output data would logically be organized in a same two dimensional array as the output data itself. Embodiments of the virtual ISA instruction format for performing an atomic act on output data and writing the resultant to the statistics region 406 are described in more detail further below.

FIG. 4c shows each of the virtual processors reading 414 a constant value from a constant look-up table 415 within the constant memory region 407. Here, e.g., it is expected that different threads may need a same constant or other value on the same clock cycle (e.g., a particular multiplier to be applied against an entire image). Thus, accesses into the constant look-up table 415 return a same, scalar value to each of the virtual processors as depicted in FIG. 4c. Because look-up tables are typically accessed with an index value, in an embodiment, the constant look-up table memory region is accessed with a linear random access memory address. In an embodiment the constant region of memory is read only (i.e., the processor can not change information in a constant table and is only permitted to read information from it). For simplicity FIG. 4c only shows a single constant look-up table 415 in the constant memory region 407. As threads may make use of more than one such table memory region 407 is configured to be large enough to hold as many constant tables are needed/used.

c. Virtual Processor ISA

As alluded to above in multiple instances, the virtual processor ISA may include a number of pertinent features. Some of these described at length immediately below.

In various embodiment the instruction format of each virtual processor's ISA uses a relative positioning approach to define an X, Y coordinate for each of the following: 1) a LOAD instruction that reads input image data from the input array memory region; 2) a STORE instruction that writes output image data to the output array; and, 3) an atomic update to the statistics region of memory.

The ability to easily define any input array location in combination with an entire ISA of traditional data access, mathematical and program control opcodes allows for an extremely versatile programming environment that essentially permits an application program developer to define, ideally, any desired function to be performed on any sized image surface. For example, ideally, any mathematical operation can be readily programmed to be applied to any stencil size.

In an embodiment, instructions for loads/stores from/to the input/output arrays have the following format

[OPCODE] LINEGROUP_(name)[(((X*XS+X0)/XD); ((Y*YS+Y0)/YD); Z]

where [OPCODE] is the specific type of operation (LOAD from the input array, STORE to the output array) and LINEGROUP_(name) is the name assigned to a particular section of a particular image (e.g., a line group for a frame of image data) within the input or output array memory region. Here, because different line groups are operated on separately, the different linegroups are given different names so they can be uniquely identified/accessed (e.g., LINE-GROUP_1, LINEGROUP_2, etc.). Line groups of same name may exist in both the input array memory region and the output array memory region. The origin of any line group may be, e.g., its lower left hand corner within its appropriate memory region.

In the case of instructions that perform updates on the atomic statistics table, in an embodiment, the instruction format takes on the following similar structure

[OPCODE]  STATS_(name)[(((X*XS+X0)/XD); ((Y*YS+Y0)/YD); Z]

with the notable difference being that the input operand information defines a position within a particular statistics table (STATS_(name)) rather than a particular line group within the input or output array. As with line groups, different names are given to different statistics tables so that a thread can uniquely operate on different statistics tables over the course of its operation. The [OPCODE] specifies the particular atomic act to be performed (e.g., STAT_ADD; STAT_MUL; STAT_MIN; STAT_MAX).

For either input/output array accesses or atomic statistics table accesses, the Z operand of the instruction defines which channel of a named line group or stats table is targeted by the instruction. Here, typically, a single image will have multiple channels. For example, video images typically have a red channel (R), a green channel (G) and a blue channel (B) for a same frame of the video stream. In a sense, a complete image can be viewed as separate R, G and B channel images stacked on top of each other. The Z operand defines which one of these is targeted by the instruction (e.g., Z=0 corresponds to the red channel, Z=1 corresponds to the blue channel and Z=2 corresponds to the green channel). Each line group and statistics table is therefore structured to include the content of each channel for the particular image being processed.

The (X*XS+X0)/XD operand defines the X location within a named line group or stats table that is targeted by the instruction and the (Y*YS+Y0)/YD operand defines the Y location within a named line group or stats table that is targeted by the instruction. The XS and XD terms for the X location and the YS and YD terms for the Y location are used for scaling between input and output images having different pixel densities. Scaling is described in more detail further below.

In a simplest case, there is no scaling between input and output images and the X and Y components of the instruction format simply take the form of X+X0 and Y+Y0 where X0 and Y0 are positional offsets relative to the position of the thread. A thread is viewed as being assigned to the position within the output array line group that its output value is written to. A corresponding, same position is readily identifiable in the input array line group and any stats table.

As an example, if the thread is assigned a specific X, Y location in an output array LINEGROUP_1, the instruction

LOAD LINEGROUP_1[(X−1);(Y−1);Z]

would load from LINEGROUP_1 a value that is to the left one pixel location and down one pixel location from the same X,Y position within the input array.

A simple blur kernel that averages together the pixel values for the X,Y location along with its left and right neighbors may therefore be written in pseudo-code as depicted in FIG. 5a. As observed in FIG. 5a, the location ((X);(Y)) corresponds to the position of the virtual processor that is writing to the output array. In the above pseudo-code, LOAD corresponds to the opcode for a load from the input array and STORE corresponds to the opcode for the store to the output array. Note that there exists a LINEGROUP_1 in the input array and a LINEGROUP_1 in the output array.

Figure 5B:
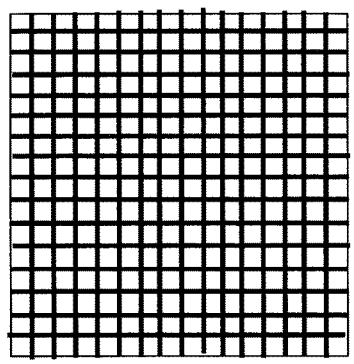
FIG. 5b shows images having different pixel densities.
Figure 5B:
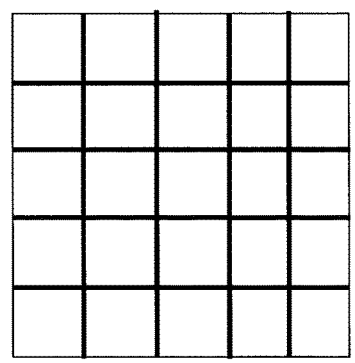

FIG. 5b depicts scaled images for purposes of explaining the scaling features of the relative positioning load and store instruction format. Down sampling refers to the transformation of a higher resolution image to a lower resolution image by providing in the output image less than all of the pixels that exist in the input image. Up sampling refers to the transformation of a lower resolution image to a higher resolution image by creating more pixels in the output image than exist in the input image.

For example, referring to FIG. 5b, if image 501 represents the input image and image 502 represents the output image, down sampling will be performed because there are less pixels in output image than in input image. Here, for each pixel in the output image, the pertinent pixels in the input image that determine the output value for an output pixel progress "farther away" from the output pixel location moving along either axis in the output image. For example, for a 3:1 down sampling ratio, the first pixel in the output image along either axis corresponds to the first, second and third pixels along the same axis in the input image, the second pixel in the output image corresponds to the fourth, fifth and sixth pixels in the input image, etc. Thus the first output pixel has a pertinent pixel in the third location while the second output pixel has a pertinent pixel in the sixth location.

As such, the XS and YS multiplicand terms in the relative positioning instruction format are used to implement down sampling. If the blur pseudo code of FIG. 5a where to be rewritten for 3:1 down sampling along both axis, the code would be rewritten as:

R1<=LOAD LINEGROUP_1[((3X)−1);3(Y);0]
R2<=LOAD LINEGROUP_1[3(X);3(Y);0]
R3<=LOAD LINEGROUP_1[((3X)+1);3(Y);0]
R2<=ADD R1, R2
R2<=ADD R2, R3
R2<=DIV R2, 3
STORE LINEGROUP_1[(X);(Y);(0)]; R2.

By contrast, in the case of 1:3 up-sampling (e.g., image 502 is the input image and image 501 is the output image) the XD and YD divisors would be used to create three output pixels for every input pixel along either axis. As such, the blur code would be rewritten as:

R1<=LOAD LINEGROUP_1[(X−1)/3;(Y)/3;0]
R2<=LOAD LINEGROUP_1[(X)/3;(Y)/3;0]
R3<=LOAD LINEGROUP_1[(X+1)/3;(Y)/3;0]
R2<=ADD R1, R2
R2<=ADD R2, R3
R2<=DIV R2, 3
STORE LINEGROUP_1[(X);(Y);(0)]; R2

In various embodiments the instruction format for instructions that access the private, constant and look-up portions of memory include an operand that also takes the form of a*b+c where a is a base position, b is a scaling term and c is an offset. Here, however, a linear addressing approach is taken where the a*b+c term essentially corresponds to a linear index that is applied to the targeted table. Each of these instructions also include in the opcode and an identifier of the memory region being accessed. For example, an instruction that performs a look-up from the look-up table memory region may be expressed as LOAD LKUP_(name)[(A*B+C)].

where LOAD is the opcode that identifies a load operation and LKUP_(name) specifies the name of the look-up table in the look-up table memory region being accessed. Again, multiple look-up tables may be used by a thread and therefore a naming scheme is used to identify the appropriate one of the more than one that exist in the look-up table memory region.

A similar format with similarly minded opcode may be utilized for instructions that target the constant and the private memory regions (e.g., LOAD CNST_(name)[(A*B+C)]; LOAD PRVT_(name)[(A*B+C)]. In an embodiment, look-up table and the constant table accesses are read-only (a processor can not change the data that has been placed there). As such no STORE instructions exist for these memory regions. In an embodiment the private region of memory is read/write. As such a store instruction exists for that memory region (e.g., STORE PRVT[(A*B+C)].

In various embodiments, each virtual processor includes general purpose registers that can contain integer, floating point or fixed point values. Additionally, the general purpose registers may contain data values of configurable bit width such as 8, 16 or 32 bit values. Thus, the image data at each pixel location in an input array or output array can have a data size of 8, 16 or 32 bits. Here, a virtual processor can be configured for an execution mode that establishes the bit size and the numerical format of the values within the general purpose registers. Instructions may also specify immediate operands (which are input operands whose input values are expressed directly in the instruction itself rather being found in a specified register). Immediate operands can also have configurable 8, 16 or 32 bit widths.

In an extended embodiment, each virtual processor is also capable of operating in a scalar mode or a SIMD mode internal to itself. That is, the data within a specific array location may be viewed as a scalar value or as a vector having multiple elements. For example a first configuration may establish scalar operation of 8 bits where each image array position holds a scalar 8 bit value. By contrast another configuration may establish parallel/SIMD operation of 32 bits where each image array location is assumed to hold four 8 bit values for a total data size of 32 bits per array location.

In various embodiments each virtual processor also includes registers to hold predicate values. A single predicate value is often only one bit in length and expresses a resultant from an opcode that performs a true/false or greater than/less than test on existing data. Predicate values are used, e.g., to determine branch directions through the code during execution (and therefore are used as operands in conditional branch instructions). Predicate values can also be expressed as an immediate operand in an instruction.

In various embodiments each virtual processor includes registers to hold scalar values. Here, scalar values are stored into and read from the partition space of the memory model that is reserved for constants (as discussed above with respect to FIG. 4c). Here, each virtual processor of a group of virtual processors that are processing a same image uses the same scalar value from the constant memory space. In extended embodiments scalar predicates also exist. These are values kept in register space that meet the definition of both a predicate and a scalar.

In various embodiments each virtual processor is designed as a RISC-like instruction set whose supported arithmetic instruction opcodes include any workable combination of the following: 1) ADD (addition of operands A and B); 2) SUB (subtraction of operands A and B); 3) MOV (move operand from one register to another register); 4) MUL (multiple operands A and B); 5) MAD (multiply operands A and B and add C to resultant); 6) ABS (return absolute value of operand A); 7) DIV (divide operand A by operand B); 8) SHL (shift operand A to the left); 9) SHR (shift operand A to the right); 10) MIN/MAX (return which of operands A and B is greater); 11) SEL (select specified bytes of operand A); 12) AND (return the logical AND of operands A and B); 13) OR (return the logical OR of operands A and B); 14) XOR (return the logical exclusive OR of operands A and B); 15) NOT (return the logical inverse of operand A).

The instruction set also includes standard predicate operations such as: 1) SEQ (returns a 1 if A equals B); 2) SNE (returns a 1 if A does not equal B); 3) SLT (returns a 1 if A is less than B); 4) SLE (returns a 1 if A is less than or equal to B). Control flow instructions are also included such as JMP (jump) and BRANCH each of which may include nominal variables or predicates as operands.

d. Application Software Development and Simulation Environment

Figure 6:
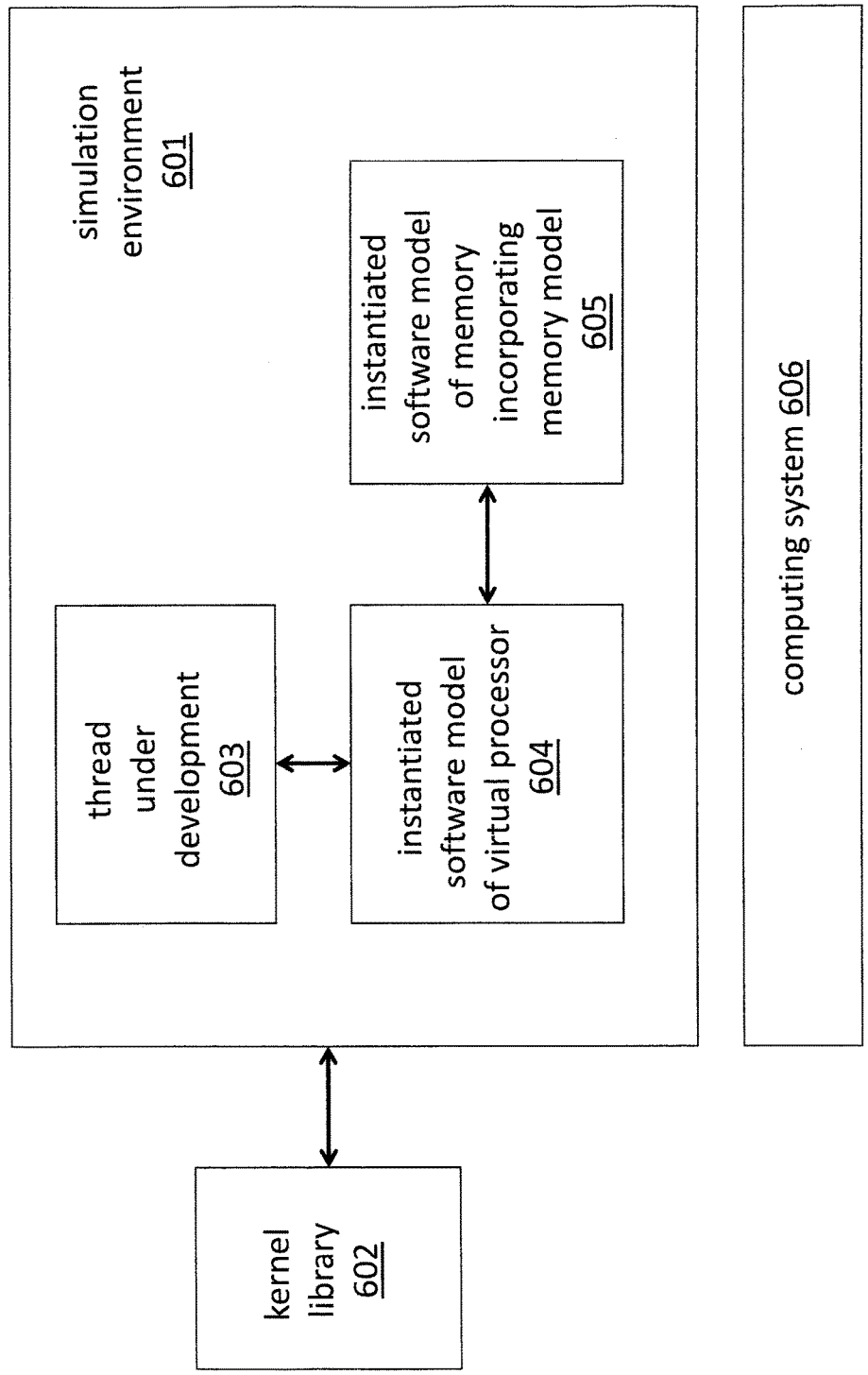
FIG. 6 shows an embodiment of an application software development and simulation environment.

FIG. 6 depicts an application software development and simulation environment 601. As discussed above with respect to FIG. 2, a developer may develop a comprehensive image processing function (e.g., an image processing pipeline where each stage in the pipeline performs a dedicated image processing task, some other DAG prescribed set of routines, etc.) by arranging kernels in a strategic sequence that is consistent with the overall intended image transformation. Kernels may be called up from a library 602 and/or the developer may develop one or more custom kernels.

Kernels within the library 602 may be provided by a third party vendor of kernels and/or a provider of any underlying technology (e.g., a vendor of a hardware platform that includes the targeted hardware image processor or a vendor of the targeted hardware image processor (e.g., provided as a design thereof or as actual hardware)).

In the case of custom developed kernels, in many situations the developer need only write the program code for a single thread 603. That is, the developer need only write program code that determines a single output pixel value by referencing input pixel values relative to the output pixel location (e.g., with the aforementioned position relative memory access instruction format). Upon satisfaction of the operation of the single thread 603, the development environment may then automatically instantiate multiple instances of the thread code on a respective virtual processor to effect a kernel on an array of processors that operate on an image surface area. The image surface area may be a section of an image frame (such as a line group).

In various embodiments, the custom thread program code is written in the object code of the virtual processor ISA (or a higher level language that is compiled down to the virtual processor ISA object code). Simulation of execution of the custom kernel's program code may be performed in a simulated runtime environment that includes a virtual processor accessing a memory organized according to the memory model. Here, software models (object oriented or otherwise) of a virtual processor 604 and a memory 605 that incorporates the model are instantiated.

The virtual processor model 604 then simulates execution of the thread code 603. Upon satisfaction of the performance of a thread, its larger kernel and any larger function that the kernel belongs to, the whole is compiled into the actual object code of the underlying hardware. The entirety of the simulation environment 601 may be implemented as software that runs on a computer system (e.g., a workstation) 606.

The following section describes embodiments of an exemplary target hardware architecture for application software written within an application software development environment having various features of the environment discussed above. It is pertinent to point out that the target hardware described below is only exemplary and conceivably many other alternative hardware architectures could be targeted by code written within the afore-described software development environment.

2.0 Hardware Architecture Embodiments a. Image Processor Hardware Architecture and Operation

Figure 7:
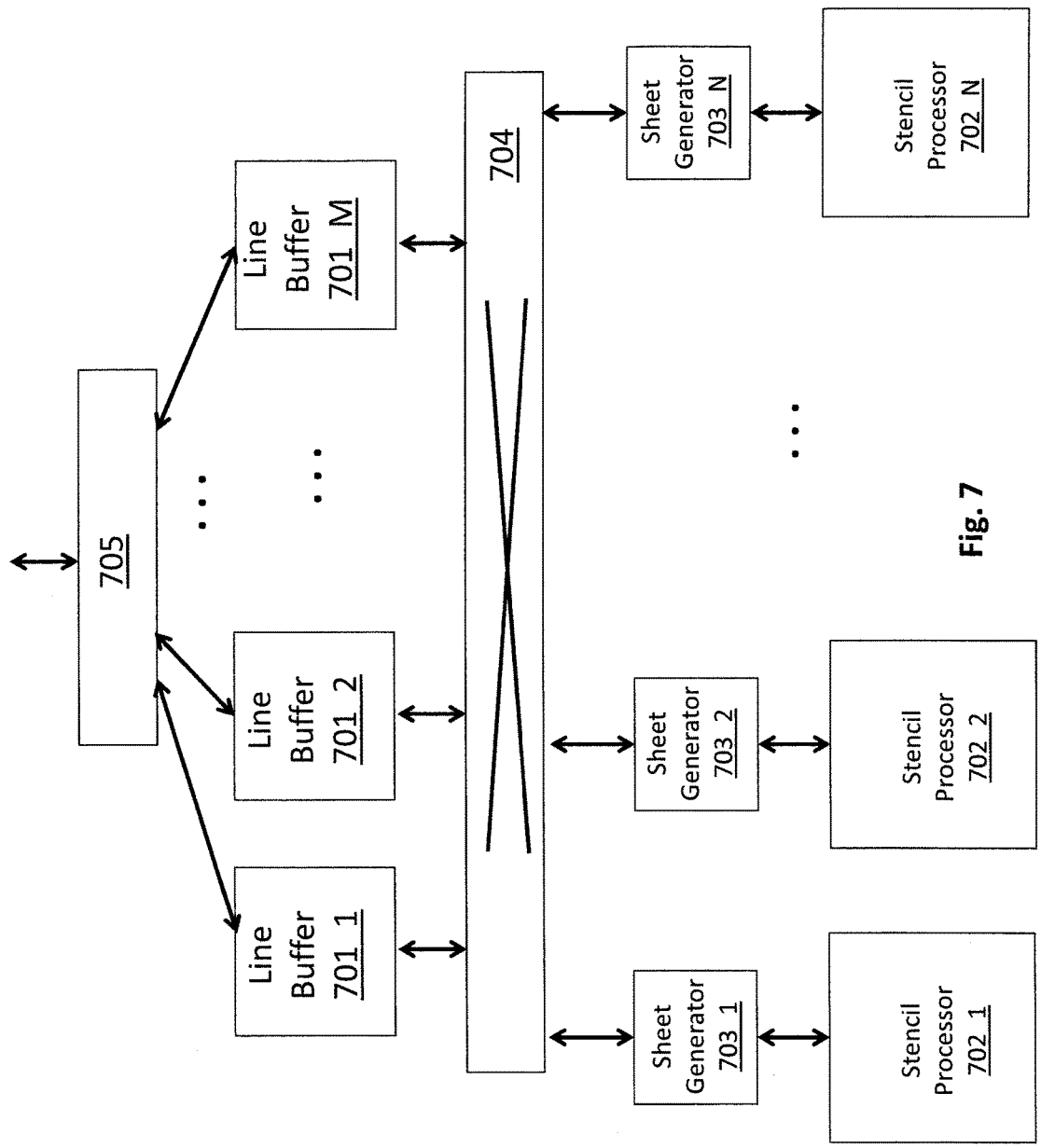
FIG. 7 shows an embodiment of an image processor hardware architecture.

FIG. 7 shows an embodiment of an architecture 700 for an image processor implemented in hardware. The image processor may be targeted, for example, by a compiler that converts program code written for a virtual processor within a simulated environment into program code that is actually executed by the hardware processor. As observed in FIG. 7, the architecture 700 includes a plurality of line buffer units 701_1 through 701_M interconnected to a plurality of stencil processor units 702_1 through 702_N and corresponding sheet generator units 703_1 through 703_N through a network 704 (e.g., a network on chip (NOC) including an on chip switch network, an on chip ring network or other kind of network). In an embodiment, any line buffer unit may connect to any sheet generator and corresponding stencil processor through the network 704.

In an embodiment, program code is compiled and loaded onto a corresponding stencil processor 702 to perform the image processing operations earlier defined by a software developer (program code may also be loaded onto the stencil processor's associated sheet generator 703, e.g., depending on design and implementation). In at least some instances an image processing pipeline may be realized by loading a first kernel program for a first pipeline stage into a first stencil processor 702_1, loading a second kernel program for a second pipeline stage into a second stencil processor 702_2, etc. where the first kernel performs the functions of the first stage of the pipeline, the second kernel performs the functions of the second stage of the pipeline, etc. and additional control flow methods are installed to pass output image data from one stage of the pipeline to the next stage of the pipeline.

In other configurations, the image processor may be realized as a parallel machine having two or more stencil processors 702_1, 702_2 operating the same kernel program code. For example, a highly dense and high data rate stream of image data may be processed by spreading frames across multiple stencil processors each of which perform the same function.

In yet other configurations, essentially any DAG of kernels may be loaded onto the hardware processor by configuring respective stencil processors with their own respective kernel of program code and configuring appropriate control flow hooks into the hardware to direct output images from one kernel to the input of a next kernel in the DAG design.

As a general flow, frames of image data are received by a macro I/O unit 705 and passed to one or more of the line buffer units 701 on a frame by frame basis. A particular line buffer unit parses its frame of image data into a smaller region of image data, referred to as a "a line group", and then passes the line group through the network 704 to a particular sheet generator. A complete or "full" singular line group may be composed, for example, with the data of multiple contiguous complete rows or columns of a frame (for simplicity the present specification will mainly refer to contiguous rows). The sheet generator further parses the line group of image data into a smaller region of image data, referred to as a "sheet", and presents the sheet to its corresponding stencil processor.

In the case of an image processing pipeline or a DAG flow having a single input, generally, input frames are directed to the same line buffer unit 701_1 which parses the image data into line groups and directs the line groups to the sheet generator 703_1 whose corresponding stencil processor 702_1 is executing the code of the first kernel in the pipeline/DAG. Upon completion of operations by the stencil processor 702_1 on the line groups it processes, the sheet generator 703_1 sends output line groups to a "downstream" line buffer unit 701_2 (in some use cases the output line group may be sent_back to the same line buffer unit 701_1 that earlier had sent the input line groups).

One or more "consumer" kernels that represent the next stage/operation in the pipeline/DAG executing on their own respective other sheet generator and stencil processor (e.g., sheet generator 703_2 and stencil processor 702_2) then receive from the downstream line buffer unit 701_2 the image data generated by the first stencil processor 702_1. In this manner, a "producer" kernel operating on a first stencil processor has its output data forwarded to a "consumer" kernel operating on a second stencil processor where the consumer kernel performs the next set of tasks after the producer kernel consistent with the design of the overall pipeline or DAG.

A stencil processor 702 is designed to simultaneously operate on multiple overlapping stencils of image data. The multiple overlapping stencils and internal hardware processing capacity of the stencil processor effectively determines the size of a sheet. Here, within a stencil processor 702, arrays of execution lanes operate in unison to simultaneously process the image data surface area covered by the multiple overlapping stencils.

As will be described in more detail below, in various embodiments, sheets of image data are loaded into a two-dimensional register array structure within the stencil processor 702. The use of sheets and the two-dimensional register array structure is believed to effectively provide for power consumption improvements by moving a large amount of data into a large amount of register space as, e.g., a single load operation with processing tasks performed directly on the data immediately thereafter by an execution lane array. Additionally, the use of an execution lane array and corresponding register array provide for different stencil sizes that are easily programmable/configurable.

FIGS. 8a through 8e illustrate at a high level embodiments of both the parsing activity of a line buffer unit 701, the finer grained parsing activity of a sheet generator unit 703 as well as the stencil processing activity of the stencil processor 702 that is coupled to the sheet generator unit 703.

Figure 8A:
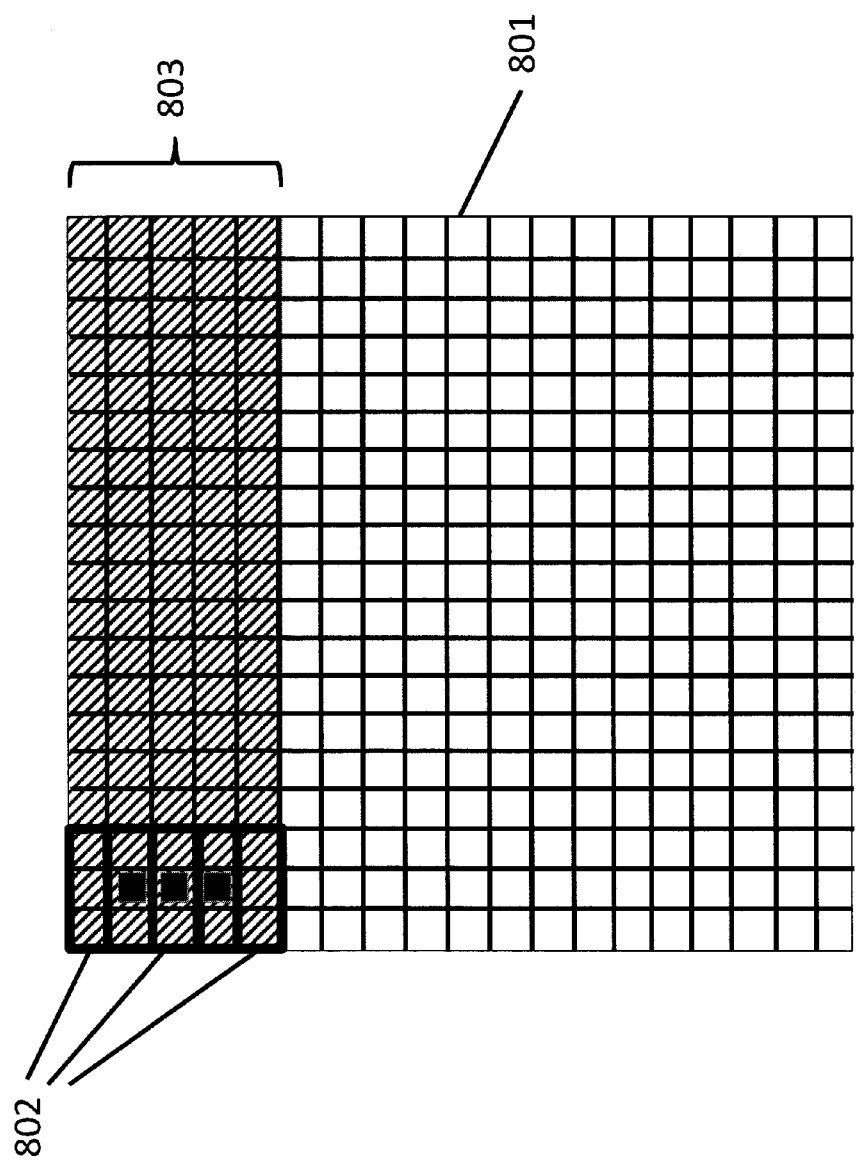
FIGS. 8a, 8b, 8c, 8d and 8e depict the parsing of image data into a line group, the parsing of a line group into a sheet and the operation performed on a sheet with overlapping stencils.

FIG. 8a depicts an embodiment of an input frame of image data 801. FIG. 8a also depicts an outline of three overlapping stencils 802 (each having a dimension of 3 pixels×3 pixels) that a stencil processor is designed to operate over. The output pixel that each stencil respectively generates output image data for is highlighted in solid black. For simplicity, the three overlapping stencils 802 are depicted as overlapping only in the vertical direction. It is pertinent to recognize that in actuality a stencil processor may be designed to have overlapping stencils in both the vertical and horizontal directions.

Because of the vertical overlapping stencils 802 within the stencil processor, as observed in FIG. 8a, there exists a wide band of image data within the frame that a single stencil processor can operate over. As will be discussed in more detail below, in an embodiment, the stencil processors process data within their overlapping stencils in a left to right fashion across the image data (and then repeat for the next set of lines, in top to bottom order). Thus, as the stencil processors continue forward with their operation, the number of solid black output pixel blocks will grow right-wise horizontally. As discussed above, a line buffer unit 701 is responsible for parsing a line group of input image data from an incoming frame that is sufficient for the stencil processors to operate over for an extended number of upcoming cycles. An exemplary depiction of a line group is illustrated as a shaded region 803. In an embodiment, as described further below, the line buffer unit 701 can comprehend different dynamics for sending/receiving a line group to/from a sheet generator. For example, according to one mode, referred to as "full group", the complete full width lines of image data are passed between a line buffer unit and a sheet generator. According to a second mode, referred to as "virtually tall", a line group is passed initially with a subset of full width rows. The remaining rows are then passed sequentially in smaller (less than full width) pieces.

With the line group 803 of the input image data having been defined by the line buffer unit and passed to the sheet generator unit, the sheet generator unit further parses the line group into finer sheets that are more precisely fitted to the hardware limitations of the stencil processor. More specifically, as will be described in more detail further below, in an embodiment, each stencil processor consists of a two dimensional shift register array. The two dimensional shift register array essentially shifts image data "beneath" an array of execution lanes where the pattern of the shifting causes each execution lane to operate on data within its own respective stencil (that is, each execution lane processes on its own stencil of information to generate an output for that stencil). In an embodiment, sheets are surface areas of input image data that "fill" or are otherwise loaded into the two dimensional shift register array.

Figure 8B:
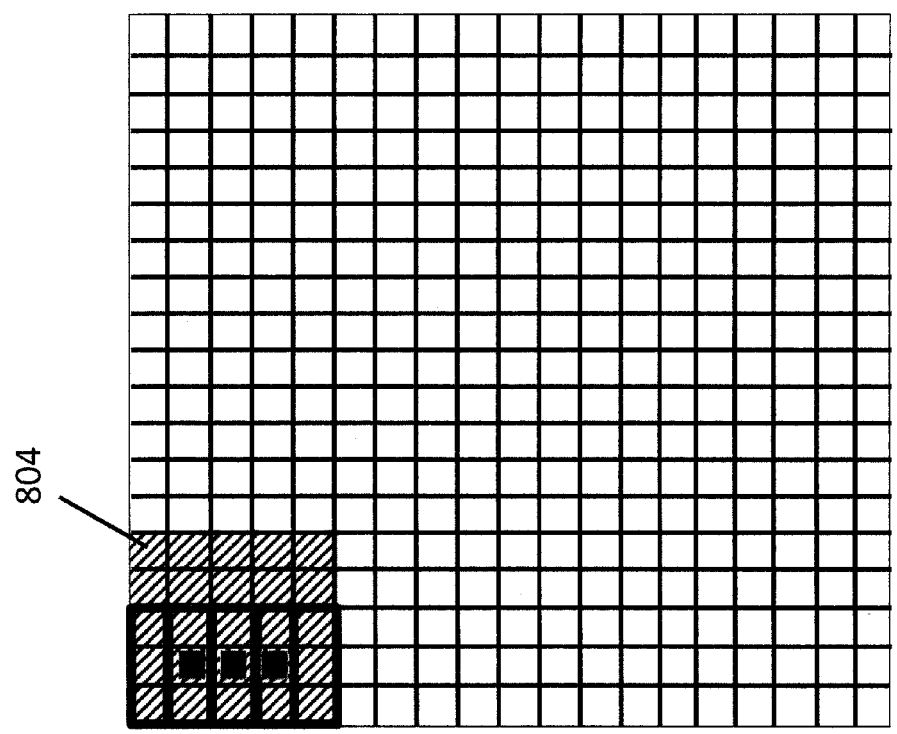
Figure 8C:
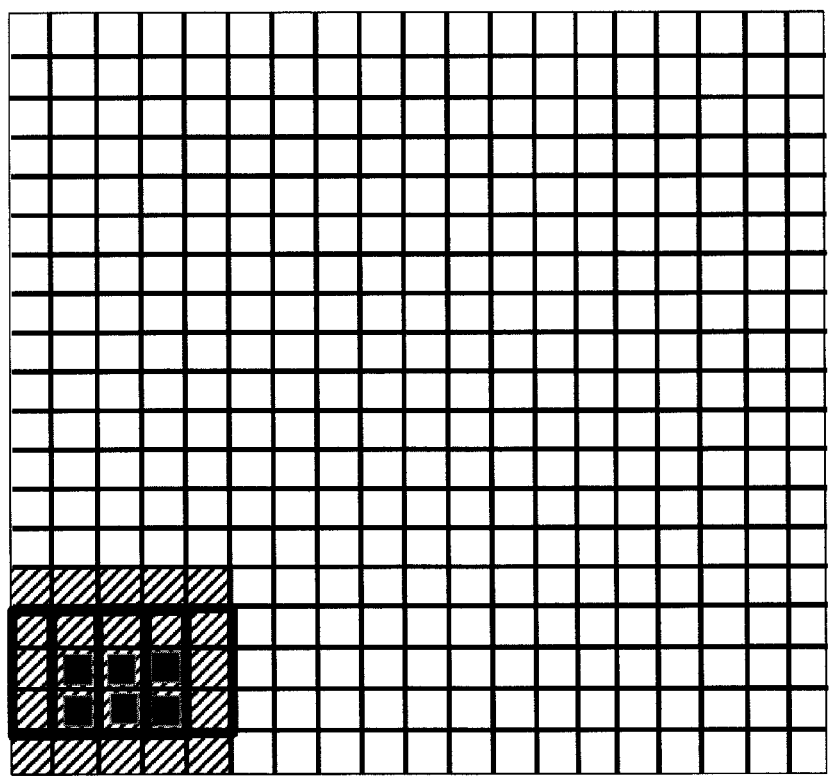
Figure 8D:
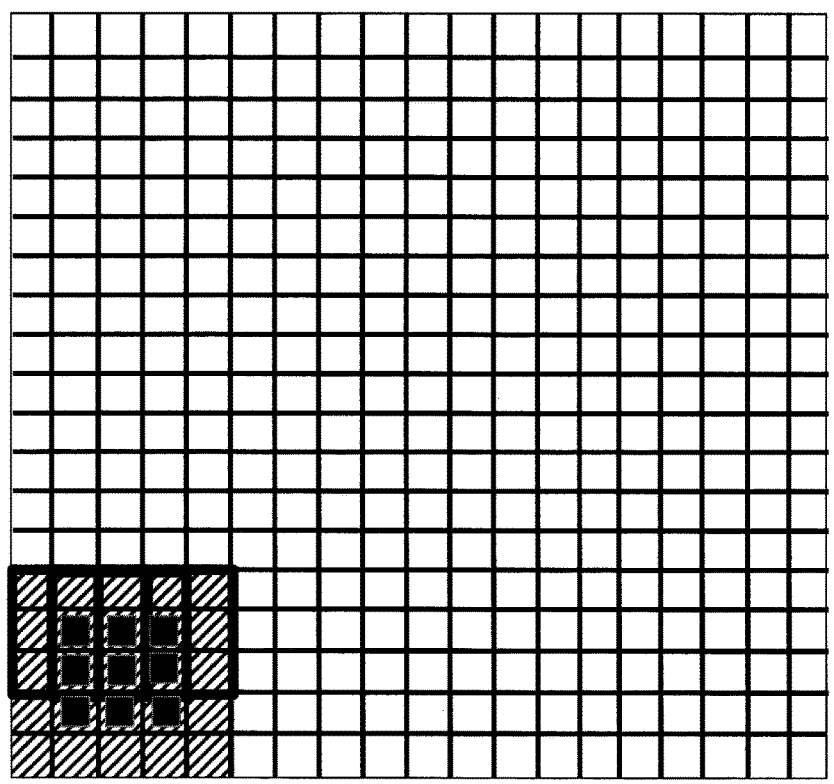

Thus, as observed in FIG. 8b, the sheet generator parses an initial sheet 804 from the line group 803 and provides it to the stencil processor (here, the sheet of data corresponds to the shaded region that is generally identified by reference number 804). As observed in FIGS. 8c and 8d, the stencil processor operates on the sheet of input image data by effectively moving the overlapping stencils 802 in a left to right fashion over the sheet. As of FIG. 8d, the number of pixels for which an output value could be calculated from the data within the sheet is exhausted (no other pixel positions can have an output value determined from the information within the sheet). For simplicity the border regions of the image have been ignored.

Figure 8E:
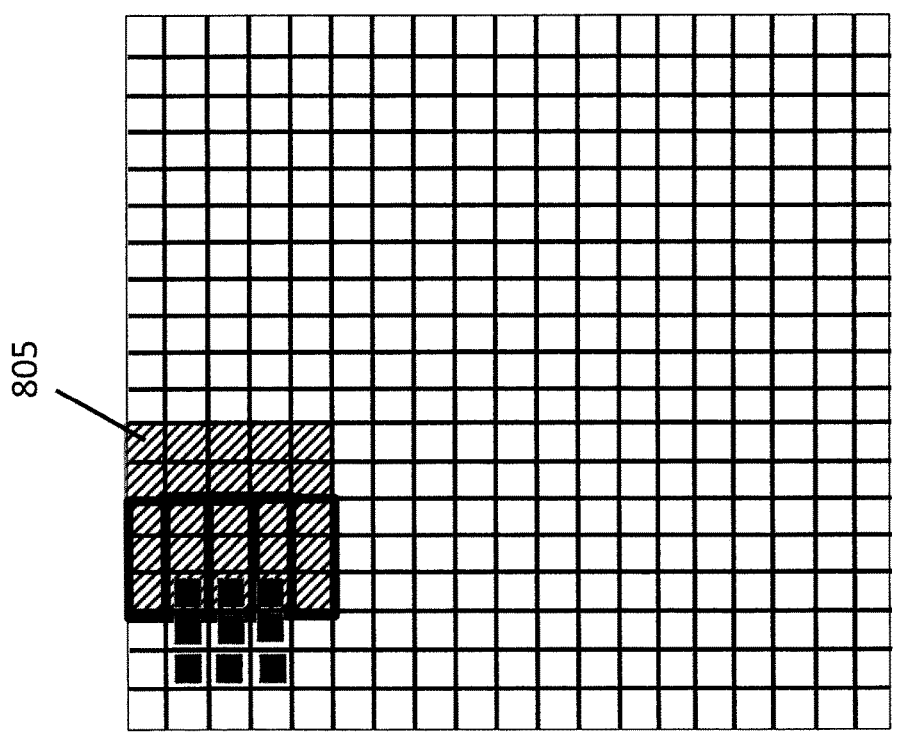

As observed in FIG. 8e the sheet generator then provides a next sheet 805 for the stencil processor to continue operations on. Note that the initial positions of the stencils as they begin operation on the next sheet is the next progression to the right from the point of exhaustion on the first sheet (as depicted previously in FIG. 8d). With the new sheet 805, the stencils will simply continue moving to the right as the stencil processor operates on the new sheet in the same manner as with the processing of the first sheet.

Note that there is some overlap between the data of the first sheet 804 and the data of the second sheet 805 owing to the border regions of stencils that surround an output pixel location. The overlap could be handled simply by the sheet generator re-transmitting the overlapping data twice. In alternate implementations, to feed a next sheet to the stencil processor, the sheet generator may proceed to only send new data to the stencil processor and the stencil processor reuses the overlapping data from the previous sheet.

b. Stencil Processor Design and Operation

Figure 9A:
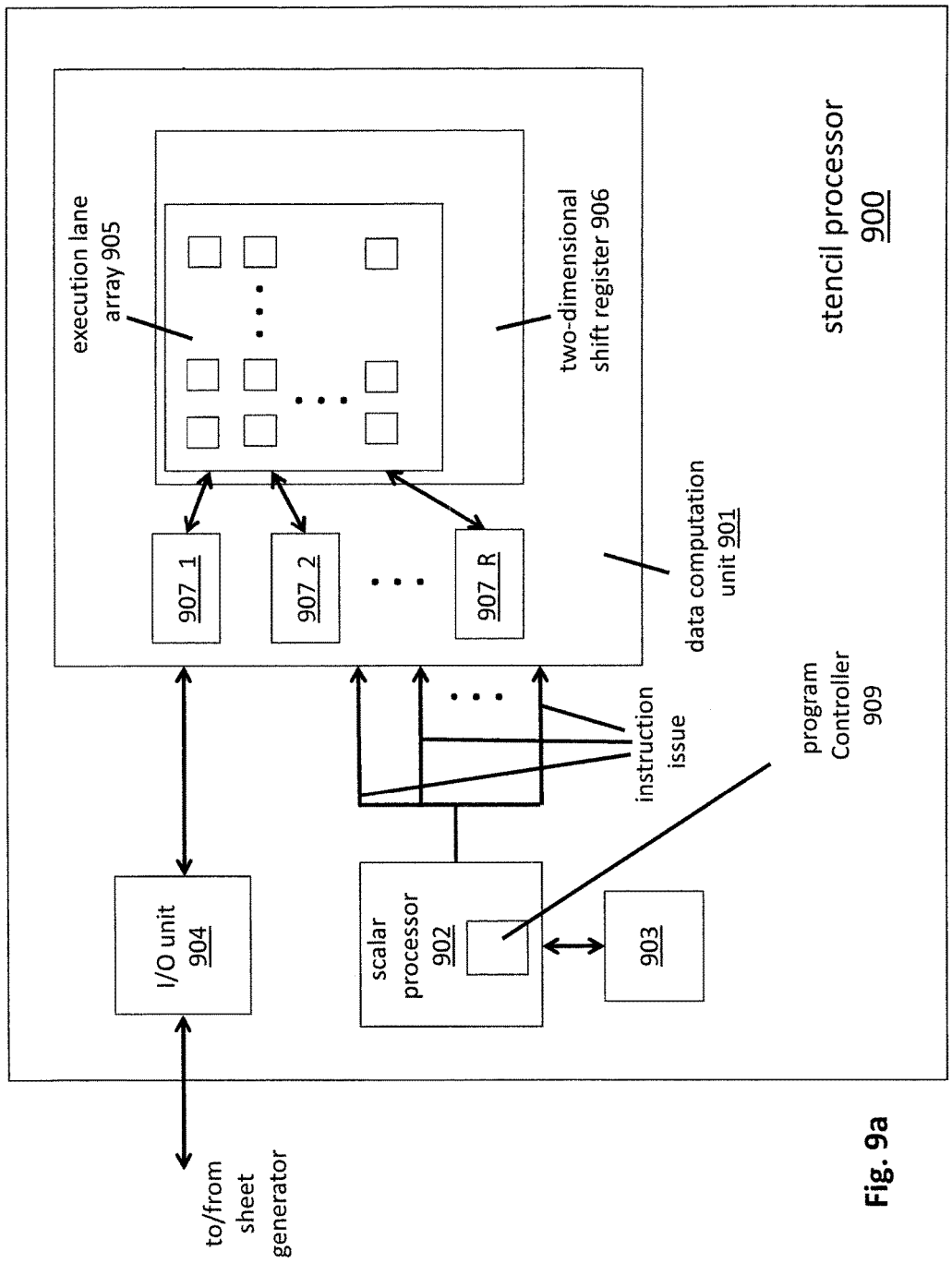
FIG. 9a shows an embodiment of a stencil processor.

FIG. 9a shows an embodiment of a stencil processor architecture 900. As observed in FIG. 9a, the stencil processor includes a data computation unit 901, a scalar processor 902 and associated memory 903 and an I/O unit 904. The data computation unit 901 includes an array of execution lanes 905, a two-dimensional shift array structure 906 and separate random access memories 907 associated with specific rows or columns of the array.

The I/O unit 904 is responsible for loading "input" sheets of data received from the sheet generator into the data computation unit 901 and storing "output" sheets of data from the stencil processor into the sheet generator. In an embodiment the loading of sheet data into the data computation unit 901 entails parsing a received sheet into rows/columns of image data and loading the rows/columns of image data into the two dimensional shift register structure 906 or respective random access memories 907 of the rows/columns of the execution lane array (described in more detail below). If the sheet is initially loaded into memories 907, the individual execution lanes within the execution lane array 905 may then load sheet data into the two-dimensional shift register structure 906 from the random access memories 907 when appropriate (e.g., as a load instruction just prior to operation on the sheet's data). Upon completion of the loading of a sheet of data into the register structure 906 (whether directly from a sheet generator or from memories 907), the execution lanes of the execution lane array 905 operate on the data and eventually "write back" finished data as a sheet directly back to the sheet generator, or, into the random access memories 907. If the later the I/O unit 904 fetches the data from the random access memories 907 to form an output sheet which is then forwarded to the sheet generator.

The scalar processor 902 includes a program controller 909 that reads the instructions of the stencil processor's program code from scalar memory 903 and issues the instructions to the execution lanes in the execution lane array 905. In an embodiment, a single same instruction is broadcast to all execution lanes within the array 905 to effect a SIMD-like behavior from the data computation unit 901. In an embodiment, the instruction format of the instructions read from scalar memory 903 and issued to the execution lanes of the execution lane array 905 includes a very-long-instruction-word (VLIW) type format that includes more than one opcode per instruction. In a further embodiment, the VLIW format includes both an ALU opcode that directs a mathematical function performed by each execution lane's ALU (which, as described below, in an embodiment may specify more than one traditional ALU operation) and a memory opcode (that directs a memory operation for a specific execution lane or set of execution lanes).

The term "execution lane" refers to a set of one or more execution units capable of executing an instruction (e.g., logic circuitry that can execute an instruction). An execution lane can, in various embodiments, include more processor-like functionality beyond just execution units, however. For example, besides one or more execution units, an execution lane may also include logic circuitry that decodes a received instruction, or, in the case of more MIMD-like designs, logic circuitry that fetches and decodes an instruction. With respect to MIMD-like approaches, although a centralized program control approach has largely been described herein, a more distributed approach may be implemented in various alternative embodiments (e.g., including program code and a program controller within each execution lane of the array 905).

The combination of an execution lane array 905, program controller 909 and two dimensional shift register structure 906 provides a widely adaptable/configurable hardware platform for a broad range of programmable functions. For example, application software developers are able to program kernels having a wide range of different functional capability as well as dimension (e.g., stencil size) given that the individual execution lanes are able to perform a wide variety of functions and are able to readily access input image data proximate to any output array location.

Apart from acting as a data store for image data being operated on by the execution lane array 905, the random access memories 907 may also keep one or more look-up tables such as any look-up tables held in the look-up table component of the virtual processing memory described above in Section 1.0. In various embodiments one or more scalar look-up tables may also be instantiated within the scalar memory 903. The one or more scalar look-up tables may be any scalar look-up tables held in the scalar look-up table component of the memory model described above in Section 1.0.

A scalar look-up involves passing the same data value from the same look-up table from the same index to each of the execution lanes within the execution lane array 905. In various embodiments, the VLIW instruction format described above is expanded to also include a scalar opcode that directs a look-up operation performed by the scalar processor into a scalar look-up table. The index that is specified for use with the opcode may be an immediate operand or fetched from some other data storage location. Regardless, in an embodiment, a look-up from a scalar look-up table within scalar memory essentially involves broadcasting the same data value to all execution lanes within the execution lane array 905 during a the same clock cycle. Additional details concerning the use and operation of look-up tables is provided further below.

Figure 9B:
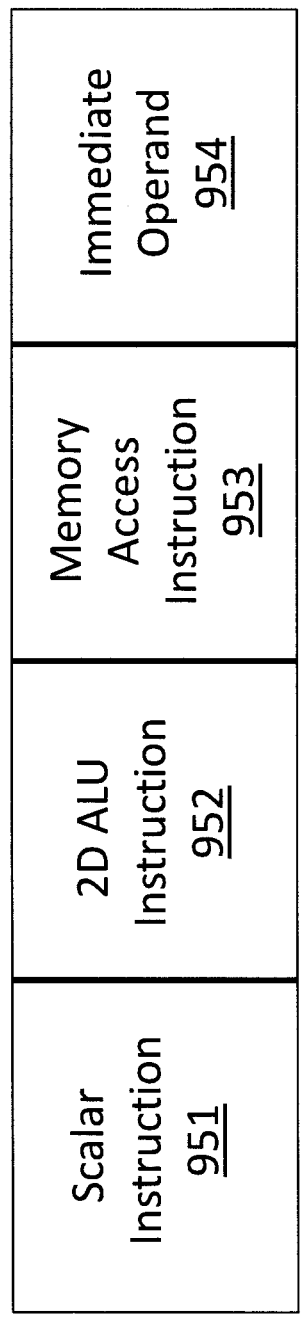
FIG. 9b shows an embodiment of a instruction word of the stencil processor.

FIG. 9b summarizes the VLIW instruction word embodiments(s) discussed above. As observed in FIG. 9b, the VLIW instruction word format includes fields for three separate instructions: 1) a scalar instruction 951 that is executed by the scalar processor; 2) an ALU instruction 952 that is broadcasted and executed in SIMD fashion by the respective ALUs within the execution lane array; and, 3) a memory instruction 953 that is broadcasted and executed in a partial SIMD fashion (e.g., if execution lanes along a same row in the execution lane array share a same random access memory, then one execution lane from each of the different rows actually execute the instruction (the format of the memory instruction 953 may include an operand that identifies which execution lane from each row executes the instruction)

A field 954 for one or more immediate operands is also included. Which of the instructions 951, 952, 953 use which immediate operand information may be identified in the instruction format. Each of instructions 951, 952, 953 also include their own respective input operand and resultant information (e.g., local registers for ALU operations and a local register and a memory address for memory access instructions). In an embodiment, the scalar instruction 951 is executed by the scalar processor before the execution lanes within the execution lane array execute either of the other to instructions 952, 953. That is, the execution of the VLIW word includes a first cycle upon which the scalar instruction 951 is executed followed by a second cycle upon with the other instructions 952, 953 may be executed (note that in various embodiments instructions 952 and 953 may be executed in parallel).

In an embodiment, the scalar instructions executed by the scalar processor include commands issued to the sheet generator to load/store sheets from/into the memories or 2D shift register of the data computation unit. Here, the sheet generator's operation can be dependent on the operation of the line buffer unit or other variables that prevent pre-runtime comprehension of the number of cycles it will take the sheet generator to complete any command issued by the scalar processor. As such, in an embodiment, any VLIW word whose scalar instruction 951 corresponds to or otherwise causes a command to be issued to the sheet generator also includes no-operation (NOOP) instructions in the other two instruction field 952, 953. The program code then enters a loop of NOOP instructions for instruction fields 952, 953 until the sheet generator completes its load/store to/from the data computation unit. Here, upon issuing a command to the sheet generator, the scalar processor may set a bit of an interlock register that the sheet generator resets upon completion of the command. During the NOOP loop the scalar processor monitors the bit of the interlock bit. When the scalar processor detects that the sheet generator has completed its command normal execution begins again.

Figure 10:
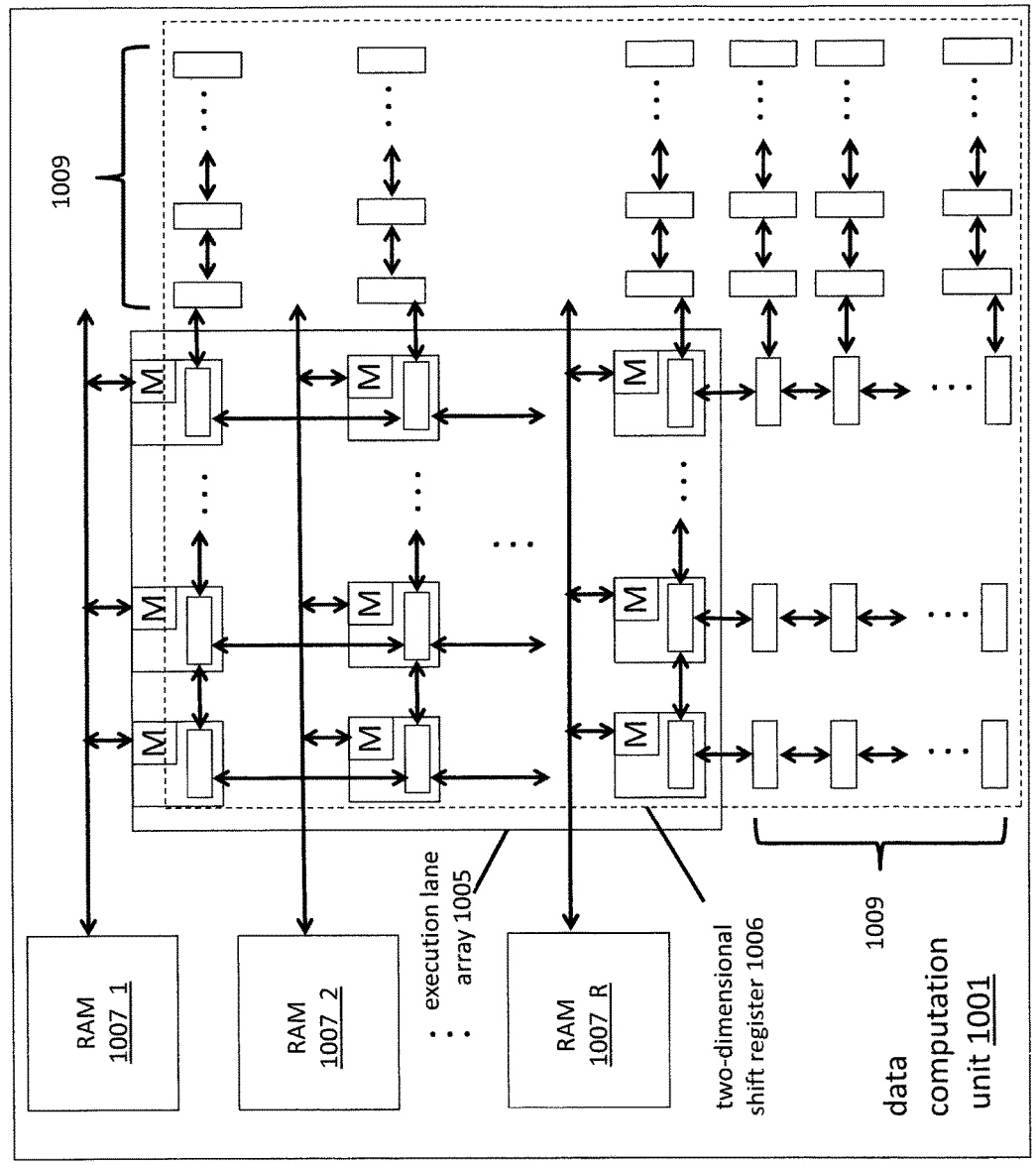
FIG. 10 shows an embodiment of a data computation unit within a stencil processor.

FIG. 10 shows an embodiment of a data computation component 1001. As observed in FIG. 10, the data computation component 1001 includes an array of execution lanes 1005 that are logically positioned "above" a two-dimensional shift register array structure 1006. As discussed above, in various embodiments, a sheet of image data provided by a sheet generator is loaded into the two-dimensional shift register 1006. The execution lanes then operate on the sheet data from the register structure 1006.

The execution lane array 1005 and shift register structure 1006 are fixed in position relative to one another. However, the data within the shift register array 1006 shifts in a strategic and coordinated fashion to cause each execution lane in the execution lane array to process a different stencil within the data. As such, each execution lane determines the output image value for a different pixel in the output sheet being generated. From the architecture of FIG. 10 it should be clear that overlapping stencils are not only arranged vertically but also horizontally as the execution lane array 1005 includes vertically adjacent execution lanes as well as horizontally adjacent execution lanes.

Some notable architectural features of the data computation unit 1001 include the shift register structure 1006 having wider dimensions than the execution lane array 1005. That is, there is a "halo" of registers 1009 outside the execution lane array 1005. Although the halo 1009 is shown to exist on two sides of the execution lane array, depending on implementation, the halo may exist on less (one) or more (three or four) sides of the execution lane array 1005. The halo 1005 serves to provide "spill-over" space for data that spills outside the bounds of the execution lane array 1005 as the data is shifting "beneath" the execution lanes 1005. As a simple case, a 5×5 stencil centered on the right edge of the execution lane array 1005 will need four halo register locations further to the right when the stencil's leftmost pixels are processed. For ease of drawing, FIG. 10 shows the registers of the right side of the halo as only having horizontal shift connections and registers of the bottom side of the halo as only having vertical shift connections when, in a nominal embodiment, registers on either side (right, bottom) would have both horizontal and vertical connections.

Additional spill-over room is provided by random access memories 1007 that are coupled to each row and/or each column in the array, or portions thereof (E.g., a random access memory may be assigned to a "region" of the execution lane array that spans 4 execution lanes row wise and 2 execution lanes column wise. For simplicity the remainder of the application will refer mainly to row and/or column based allocation schemes). Here, if an execution lane's kernel operations require it to process pixel values outside of the two-dimensional shift register array 1006 (which some image processing routines may require) the plane of image data is able to further spill-over, e.g., from the halo region 1009 into random access memory 1007. For example, consider a 6×6 stencil where the hardware includes a halo region of only four storage elements to the right of an execution lane on the right edge of the execution lane array. In this case, the data would need to be shifted further to the right off the right edge of the halo 1009 to fully process the stencil. Data that is shifted outside the halo region 1009 would then spill-over to random access memory 1007. Other applications of the random access memories 1007 and the stencil processor of FIG. 3 are provided further below.

FIGS. 11a through 11k demonstrate a working example of the manner in which image data is shifted within the two dimensional shift register array "beneath" the execution lane array as alluded to above. As observed in FIG. 11a, the data contents of the two dimensional shift array are depicted in a first array 1107 and the execution lane array is depicted by a frame 1105. Also, two neighboring execution lanes 1110 within the execution lane array are simplistically depicted. In this simplistic depiction 1110, each execution lane includes a register R1 that can accept data from the shift register, accept data from an ALU output (e.g., to behave as an accumulator across cycles), or write output data into an output destination.

Each execution lane also has available, in a local register R2, the contents "beneath" it in the two dimensional shift array. Thus, R1 is a physical register of the execution lane while R2 is a physical register of the two dimensional shift register array. The execution lane includes an ALU that can operate on operands provided by R1 and/or R2. As will be described in more detail further below, in an embodiment the shift register is actually implemented with multiple (a "depth" of) storage/register elements per array location but the shifting activity is limited to one plane of storage elements (e.g., only one plane of storage elements can shift per cycle). FIGS. 11a through 11k depict one of these deeper register locations as being used to store the resultant X from the respective execution lanes. For illustrative ease the deeper resultant register is drawn alongside rather than beneath its counterpart register R2.

FIGS. 11a through 11k focus on the calculation of two stencils whose central position is aligned with the pair of execution lane positions 1111 depicted within the execution lane array. For ease of illustration, the pair of execution lanes 1110 are drawn as horizontal neighbors when in fact, according to the following example, they are vertical neighbors.

Figure 11A:
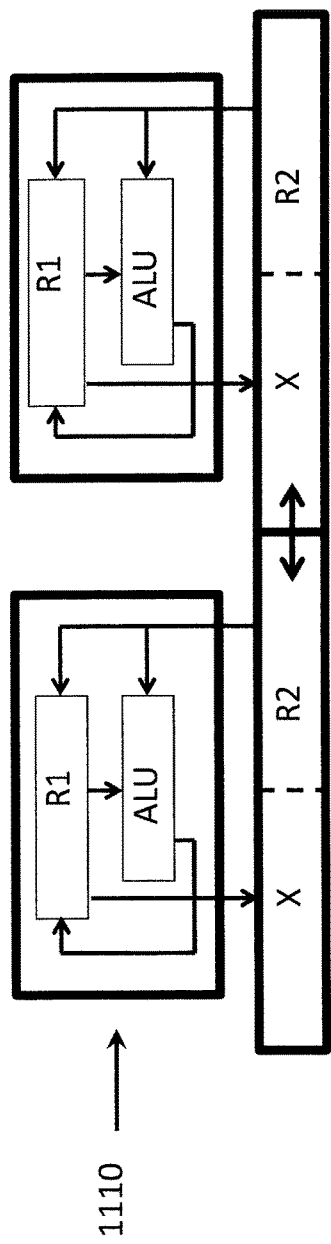
FIGS. 11a, 11b, 11c, 11d, 11e, 11f, 11g, 11h, 11i, 11j and 11k depict an example of the use of a two-dimensional shift array and an execution lane array to determine a pair of neighboring output pixel values with overlapping stencils.
Figure 11A:
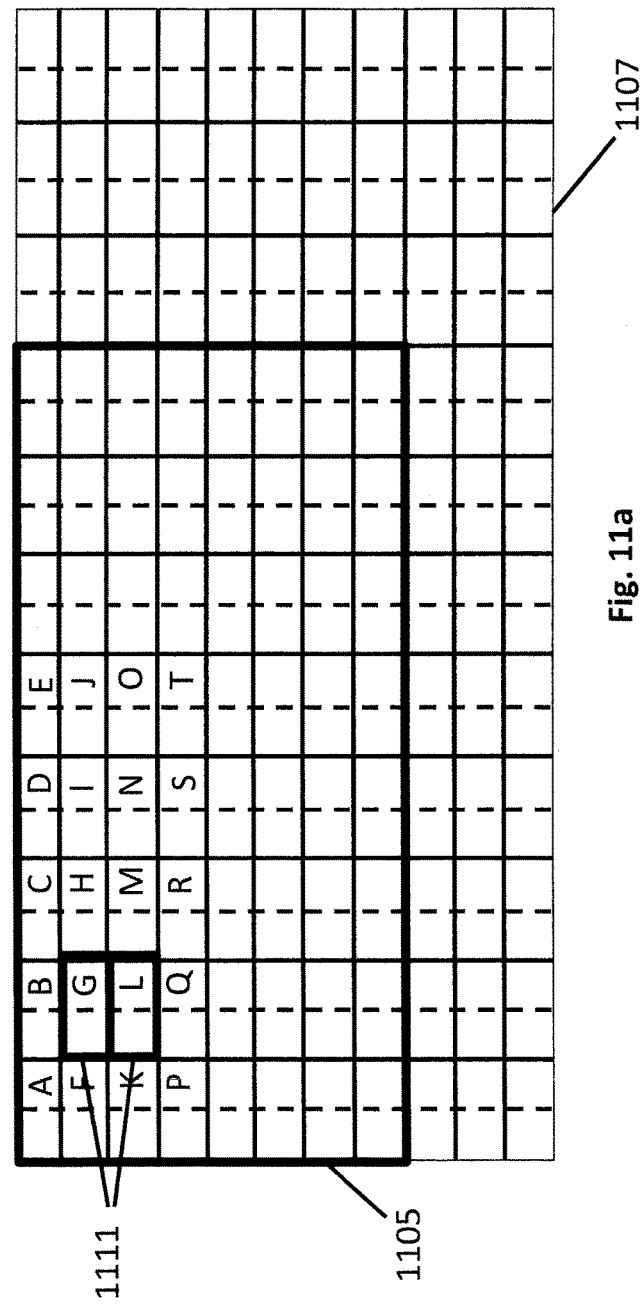
Figure 11B:
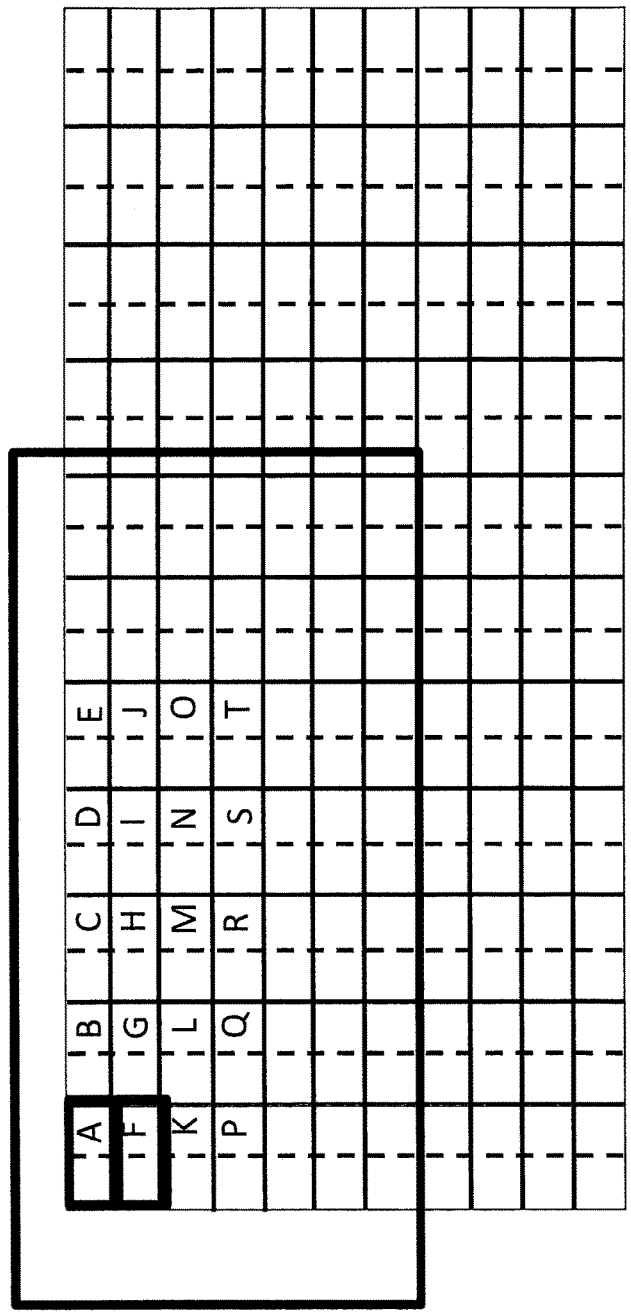

As observed initially in FIG. 11a, the execution lanes are centered on their central stencil locations. FIG. 11b shows the object code executed by both execution lanes. As observed in FIG. 11b the program code of both execution lanes causes the data within the shift register array to shift down one position and shift right one position. This aligns both execution lanes to the upper left hand corner of their respective stencils. The program code then causes the data that is located (in R2) in their respective locations to be loaded into R1.

Figure 11C:
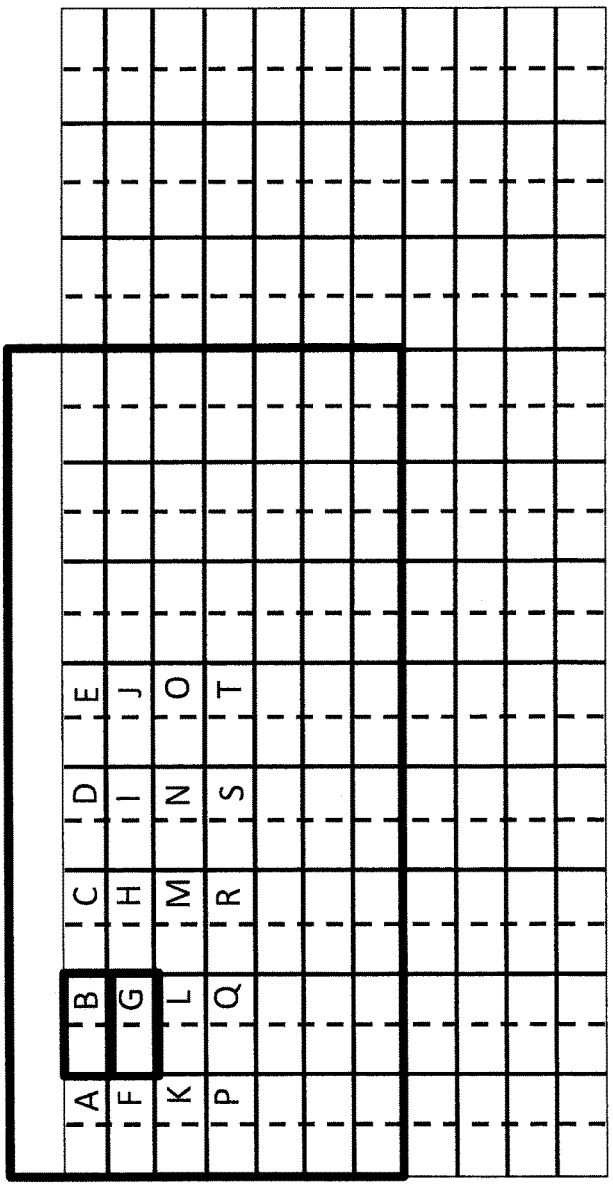
Figure 11D:
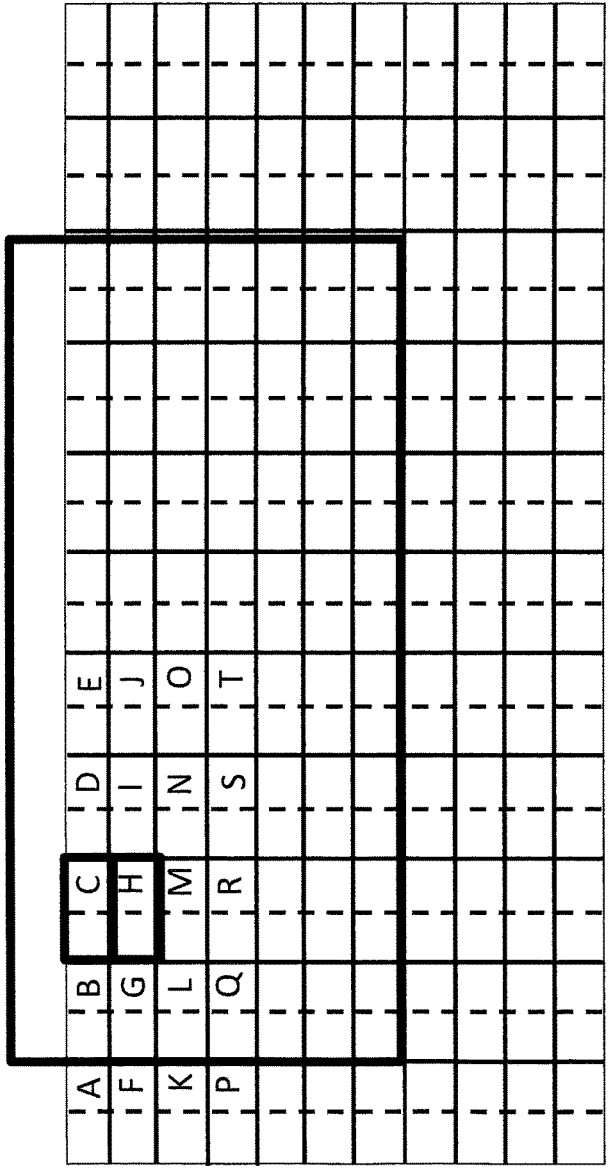

As observed in FIG. 11c the program code next causes the pair of execution lanes to shift the data within the shift register array one unit to the left which causes the value to the right of each execution lane's respective position to be shifted into each execution lane' position. The value in R1 (previous value) is then added with the new value that has shifted into the execution lane's position (in R2). The resultant is written into R1. As observed in FIG. 11d the same process as described above for FIG. 11c is repeated which causes the resultant R1 to now include the value A+B+C in the upper execution lane and F+G+H in the lower execution lane. At this point both execution lanes have processed the upper row of their respective stencils. Note the spill-over into a halo region on the left side of the execution lane array (if one exists on the left hand side) or into random access memory if a halo region does not exist on the left hand side of the execution lane array.

Figure 11E:
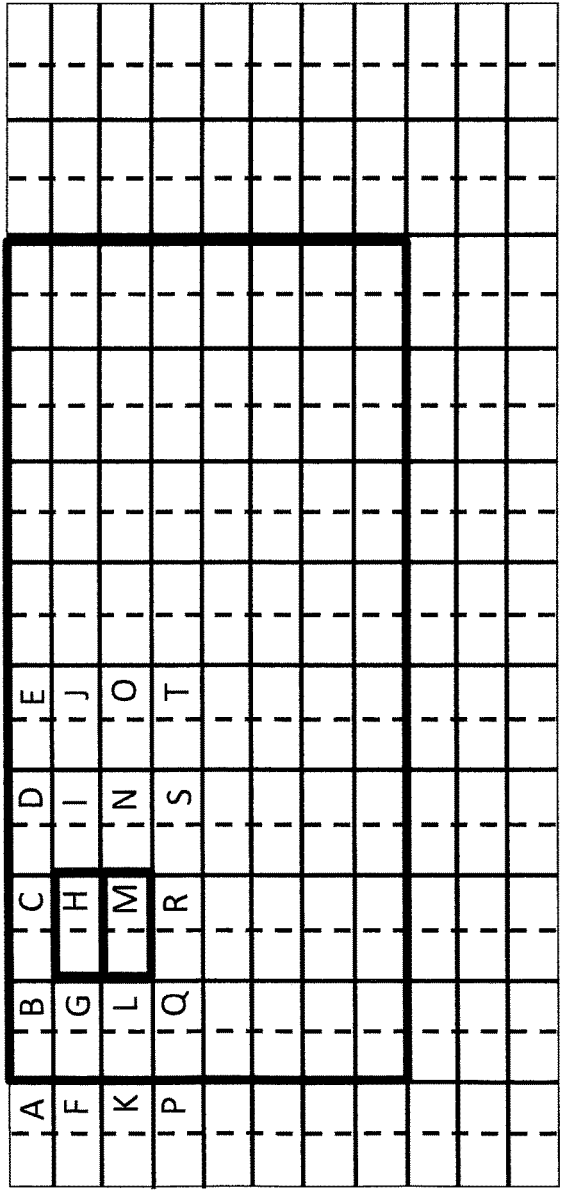
Figure 11F:
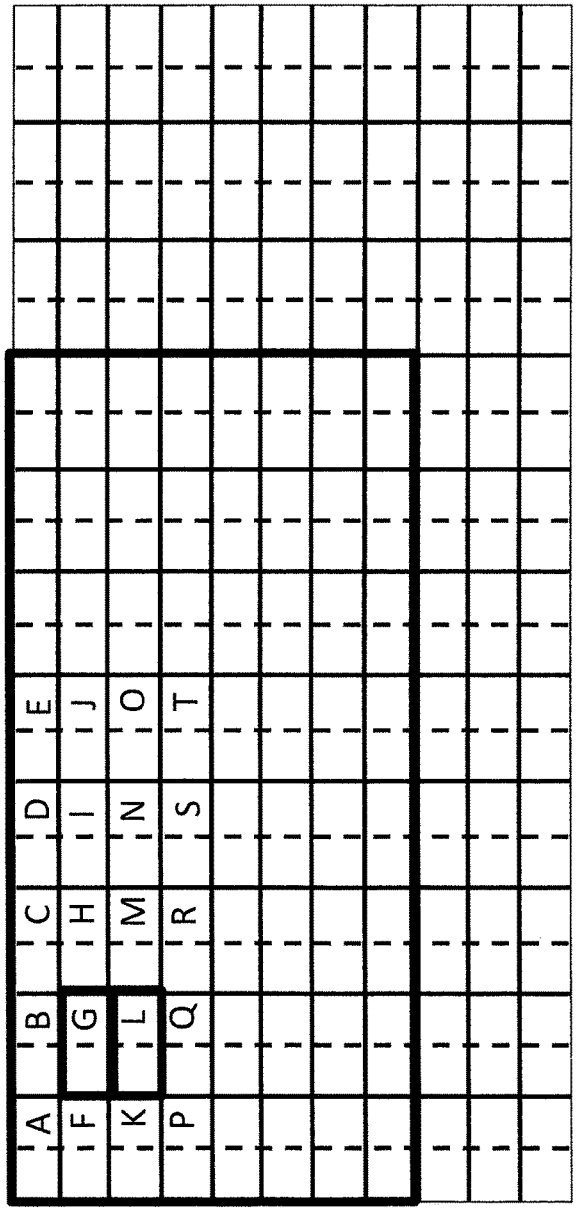
Figure 11G:
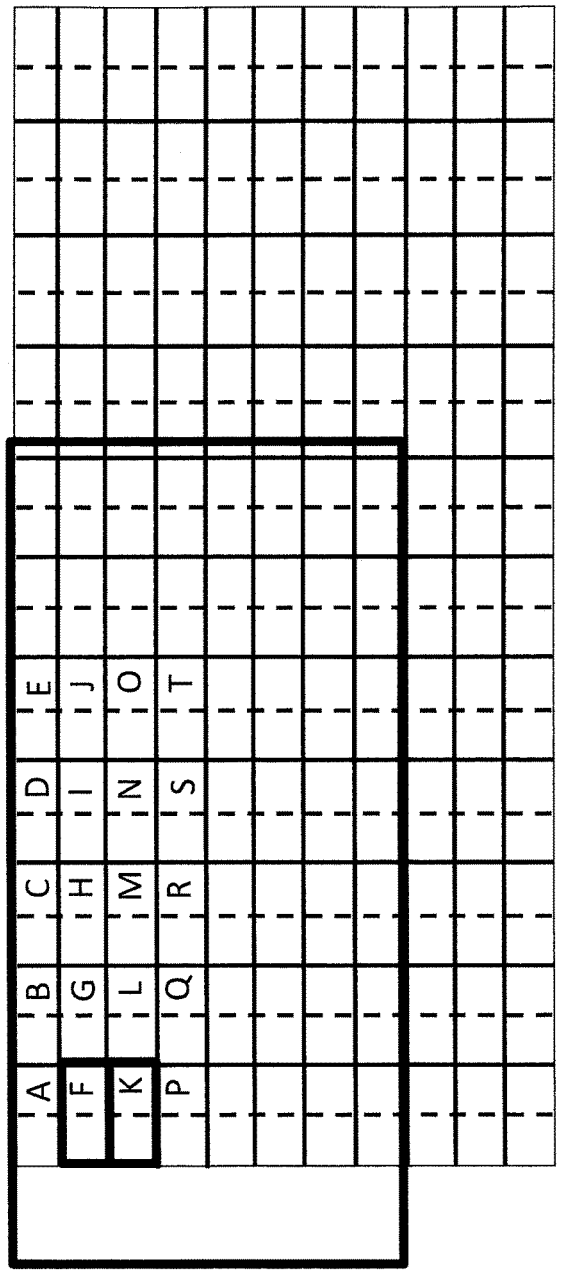

As observed in FIG. 11e, the program code next causes the data within the shift register array to shift one unit up which causes both execution lanes to be aligned with the right edge of the middle row of their respective stencils. Register R1 of both execution lanes currently includes the summation of the stencil's top row and the middle row's rightmost value. FIGS. 11f and 11g demonstrate continued progress moving leftwise across the middle row of both execution lane's stencils. The accumulative addition continues such that at the end of processing of FIG. 11g both execution lanes include the summation of the values of the top row and the middle row of their respective stencils.

Figure 11H:
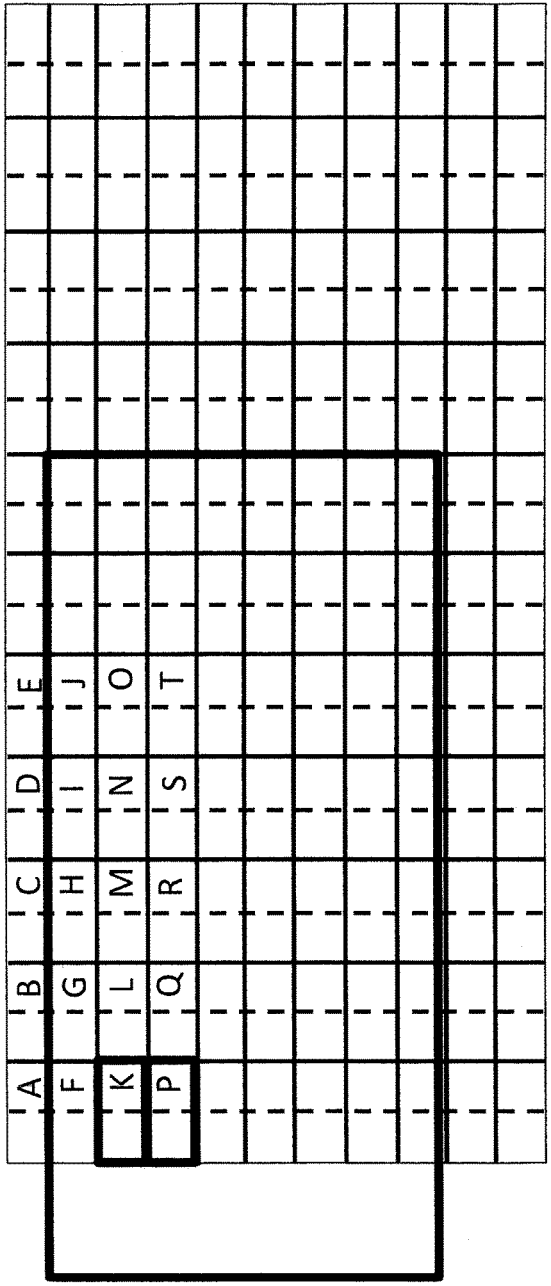
Figure 11I:
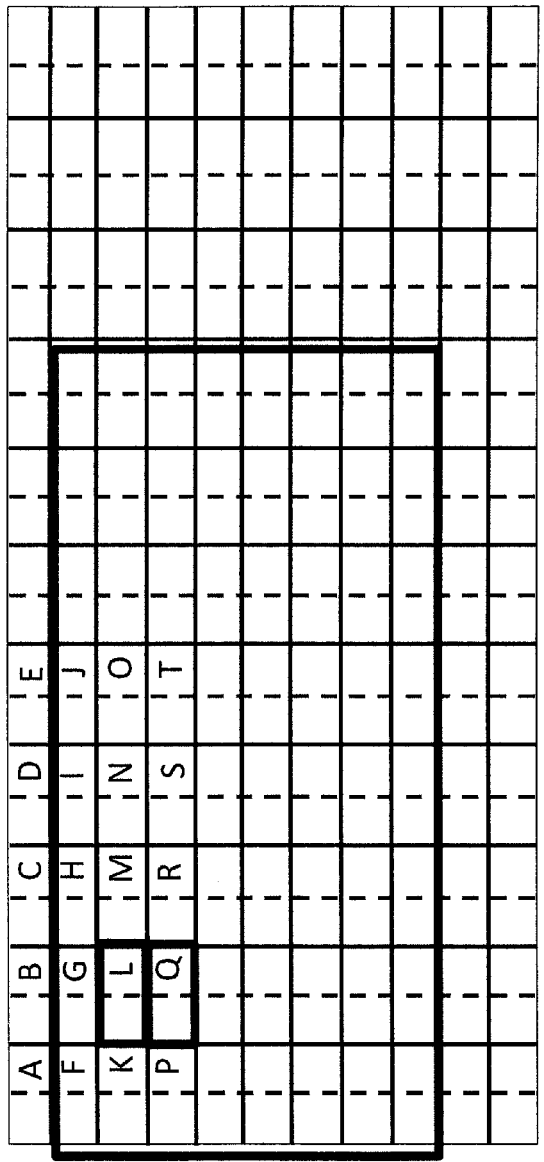
Figure 11J:
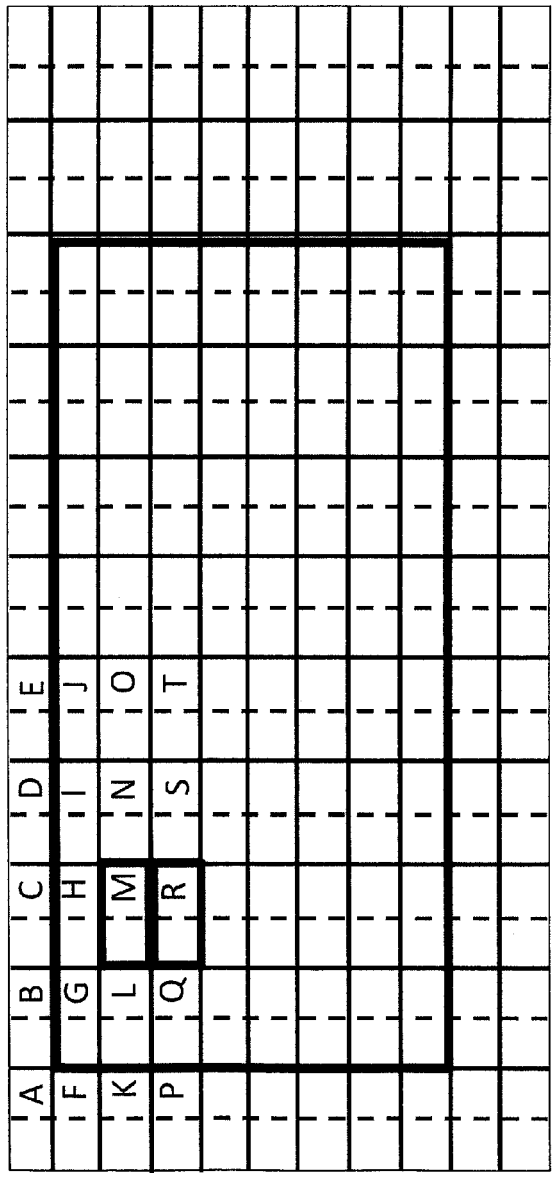
Figure 11K:
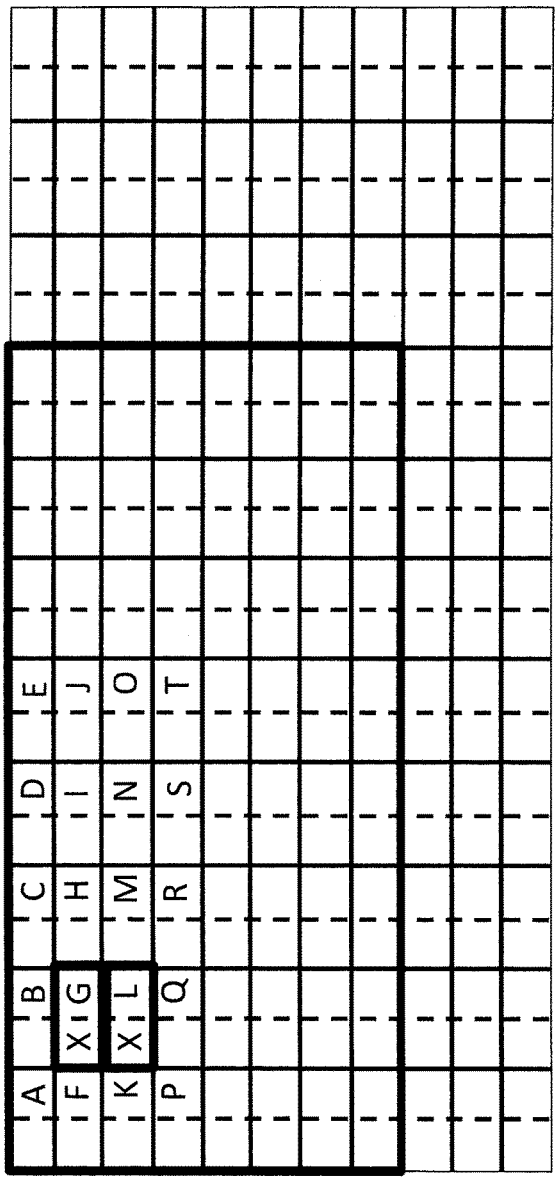

FIG. 11h shows another shift to align each execution lane with its corresponding stencil's lowest row. FIGS. 11i and 11j show continued shifting to complete processing over the course of both execution lanes' stencils. FIG. 11k shows additional shifting to align each execution lane with its correct position in the data array and write the resultant thereto.

In the example of FIGS. 11a-11k note that the object code for the shift operations may include an instruction format that identifies the direction and magnitude of the shift expressed in (X, Y) coordinates. For example, the object code for a shift up by one location may be expressed in object code as SHIFT 0, +1. As another example, a shift to the right by one location may expressed in object code as SHIFT +1, 0. In various embodiments shifts of larger magnitude may also be specified in object code (e.g., SHIFT 0, +2). Here, if the 2D shift register hardware only supports shifts by one location per cycle, the instruction may be interpreted by the machine to require multiple cycle execution, or, the 2D shift register hardware may be designed to support shifts by more than one location per cycle. Embodiments of the later are described in more detail further below.

Figure 12:
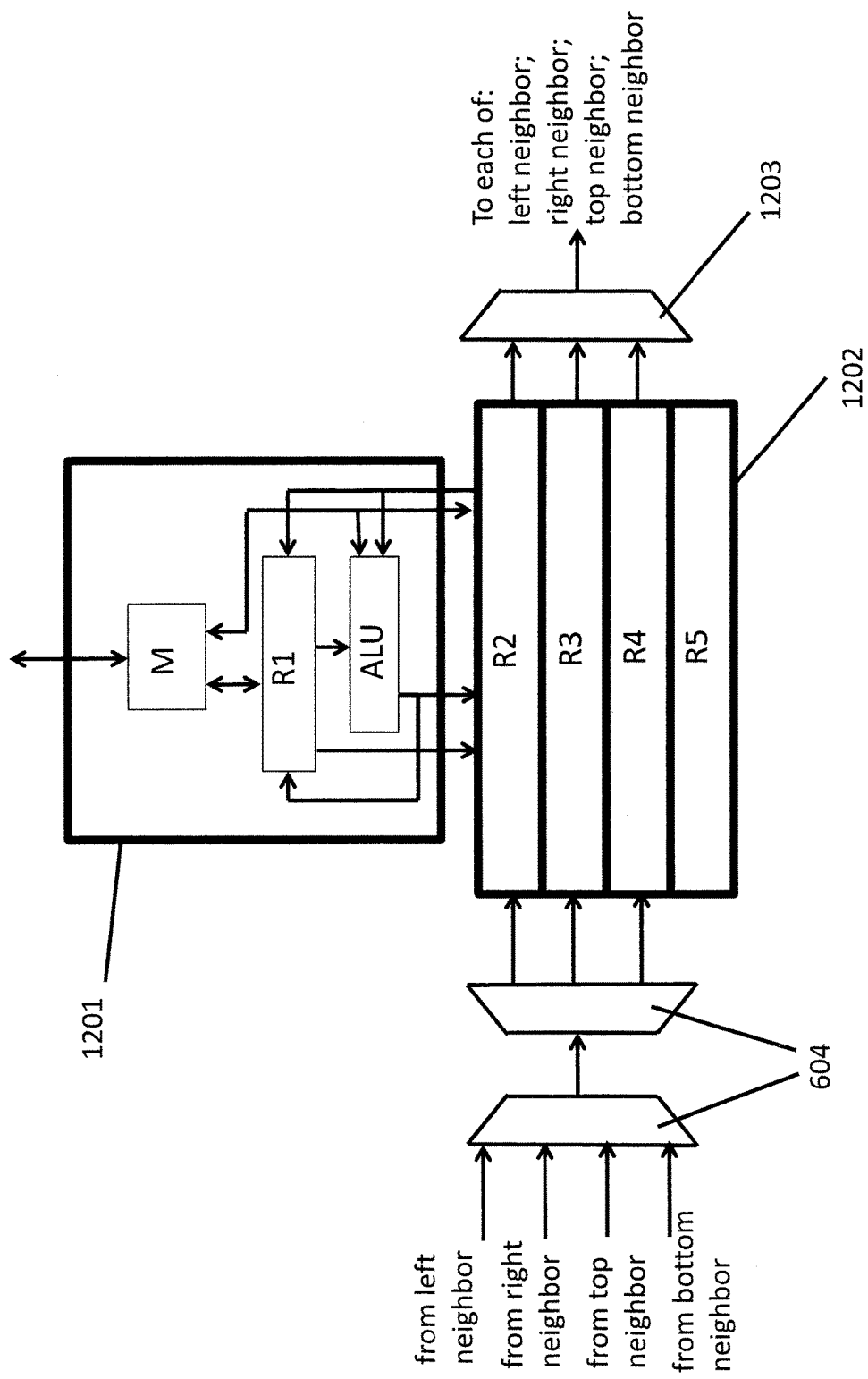
FIG. 12 shows an embodiment of a unit cell for an integrated execution lane array and two-dimensional shift array.

FIG. 12 shows another, more detailed depiction of the unit cell for the array execution lane and shift register structure (registers in the halo region do not include a corresponding execution lane). The execution lane and the register space associated with each location in the execution lane array is, in an embodiment, implemented by instantiating the circuitry observed in FIG. 12 at each node of the execution lane array. As observed in FIG. 12, the unit cell includes an execution lane 1201 coupled to a register file 1202 consisting of four registers R2 through R5. During any cycle, the execution lane 1201 may read from or write to any of registers R1 through R5. For instructions requiring two input operands the execution lane may retrieve both of operands from any of R1 through R5.

In an embodiment, the two dimensional shift register structure is implemented by permitting, during a single cycle, the contents of any of (only) one of registers R2 through R4 to be shifted "out" to one of its neighbor's register files through output multiplexer 1203, and, having the contents of any of (only) one of registers R2 through R4 replaced with content that is shifted "in" from a corresponding one if its neighbors through input multiplexers 1204 such that shifts between neighbors are in a same direction (e.g., all execution lanes shift left, all execution lanes shift right, etc.). Although it may be common for a same register to have its contents shifted out and replaced with content that is shifted in on a same cycle, the multiplexer arrangement 1203, 1204 permits for different shift source and shift target registers within a same register file during a same cycle.

As depicted in FIG. 12 note that during a shift sequence an execution lane will shift content out from its register file 1202 to each of its left, right, top and bottom neighbors. In conjunction with the same shift sequence, the execution lane will also shift content into its register file from a particular one of its left, right, top and bottom neighbors. Again, the shift out target and shift in source should be consistent with a same shift direction for all execution lanes (e.g., if the shift out is to the right neighbor, the shift in should be from the left neighbor).

Although in one embodiment the content of only one register is permitted to be shifted per execution lane per cycle, other embodiments may permit the content of more than one register to be shifted in/out. For example, the content of two registers may be shifted out/in during a same cycle if a second instance of the multiplexer circuitry 1203, 1204 observed in FIG. 12 is incorporated into the design of FIG. 12. Of course, in embodiments where the content of only one register is permitted to be shifted per cycle, shifts from multiple registers may take place between mathematical operations by consuming more clock cycles for shifts between mathematical operations (e.g., the contents of two registers may be shifted between math ops by consuming two shift ops between the math ops).

If less than all the content of an execution lane's register files are shifted out during a shift sequence note that the content of the non shifted out registers of each execution lane remain in place (do not shift). As such, any non shifted content that is not replaced with shifted in content persists local to the execution lane across the shifting cycle. The memory unit ("M") observed in each execution lane is used to load/store data from/to the random access memory space that is associated with the execution lane's row and/or column within the execution lane array. Here, the M unit acts as a standard M unit in that it is often used to load/store data that cannot be loaded/stored from/to the execution lane's own register space. In various embodiments, the primary operation of the M unit is to write data from a local register into memory, and, read data from memory and write it into a local register.

With respect to the ISA opcodes supported by the ALU unit of the hardware execution lane 1201, in various embodiments, the mathematical opcodes supported by the hardware ALU are integrally tied with (e.g., substantially the same as) the mathematical opcodes supported by a virtual execution lane (e.g., ADD, SUB, MOV, MUL, MAD, ABS, DIV, SHL, SHR, MIN/MAX, SEL, AND, OR, XOR, NOT). As described just above, memory access instructions can be executed by the execution lane 1201 to fetch/store data from/to their associated random access memory. Additionally the hardware execution lane 1201 supports shift op instructions (right, left, up, down) to shift data within the two dimensional shift register structure. As described above, program control instructions are largely executed by the scalar processor of the stencil processor.

d. Implementation Embodiments

The hardware design embodiments discussed above may be embodied within a semiconductor chip and/or as a description of a circuit design for eventual targeting toward a semiconductor manufacturing process. In the case of the later, such circuit descriptions may take of the form of higher/behavioral level circuit descriptions (e.g., a VHDL description) or lower level circuit description (e.g., a register transfer level (RTL) description, transistor level description or mask description) or various combinations thereof. Such circuit descriptions may be included, for instance, with one or more instances of the application software development environment described above in section 1.0 as target hardware for software written within the development environment. Circuit descriptions are typically embodied on a computer readable storage medium (such as a CD-ROM or other type of storage technology).

3.0 Concluding Statements

From the preceding sections is pertinent to recognize that the virtual environment described above in Section 1.0 may be instantiated on a computer system. Likewise an image processor as described above in Section 2.0 may be embodied in hardware on a computer system (e.g., as part of a handheld device's System on Chip (SOC) that processes data from the handheld device's camera).

It is pertinent to point out that the various image processor architecture features described above are not necessarily limited to image processing in the traditional sense and therefore may be applied to other applications that may (or may not) cause the image processor to be re-characterized. For example, if any of the various image processor architecture features described above were to be used in the creation and/or generation and/or rendering of animation as opposed to the processing of actual camera images, the image processor may be characterized as a graphics processing unit. Additionally, the image processor architectural features described above may be applied to other technical applications such as video processing, vision processing, image recognition and/or machine learning. Applied in this manner, the image processor may be integrated with (e.g., as a co-processor to) a more general purpose processor (e.g., that is or is part of a CPU of computing system), or, may be a stand alone processor within a computing system.

The hardware design embodiments discussed above may be embodied within a semiconductor chip and/or as a description of a circuit design for eventual targeting toward a semiconductor manufacturing process. In the case of the later, such circuit descriptions may take of the form of higher/behavioral level circuit descriptions (e.g., a VHDL description) or lower level circuit description (e.g., a register transfer level (RTL) description, transistor level description or mask description) or various combinations thereof. Circuit descriptions are typically embodied on a computer readable storage medium (such as a CD-ROM or other type of storage technology).

From the preceding sections is pertinent to recognize that an image processor as described above may be embodied in hardware on a computer system (e.g., as part of a handheld device's System on Chip (SOC) that processes data from the handheld device's camera). In cases where the image processor is embodied as a hardware circuit, note that the image data that is processed by the image processor may be received directly from a camera. Here, the image processor may be part of a discrete camera, or, part of a computing system having an integrated camera. In the case of the later the image data may be received directly from the camera or from the computing system's system memory (e.g., the camera sends its image data to system memory rather than the image processor). Note also that many of the features described in the preceding sections may be applicable to a graphics processor unit (which renders animation).

Figure 13:
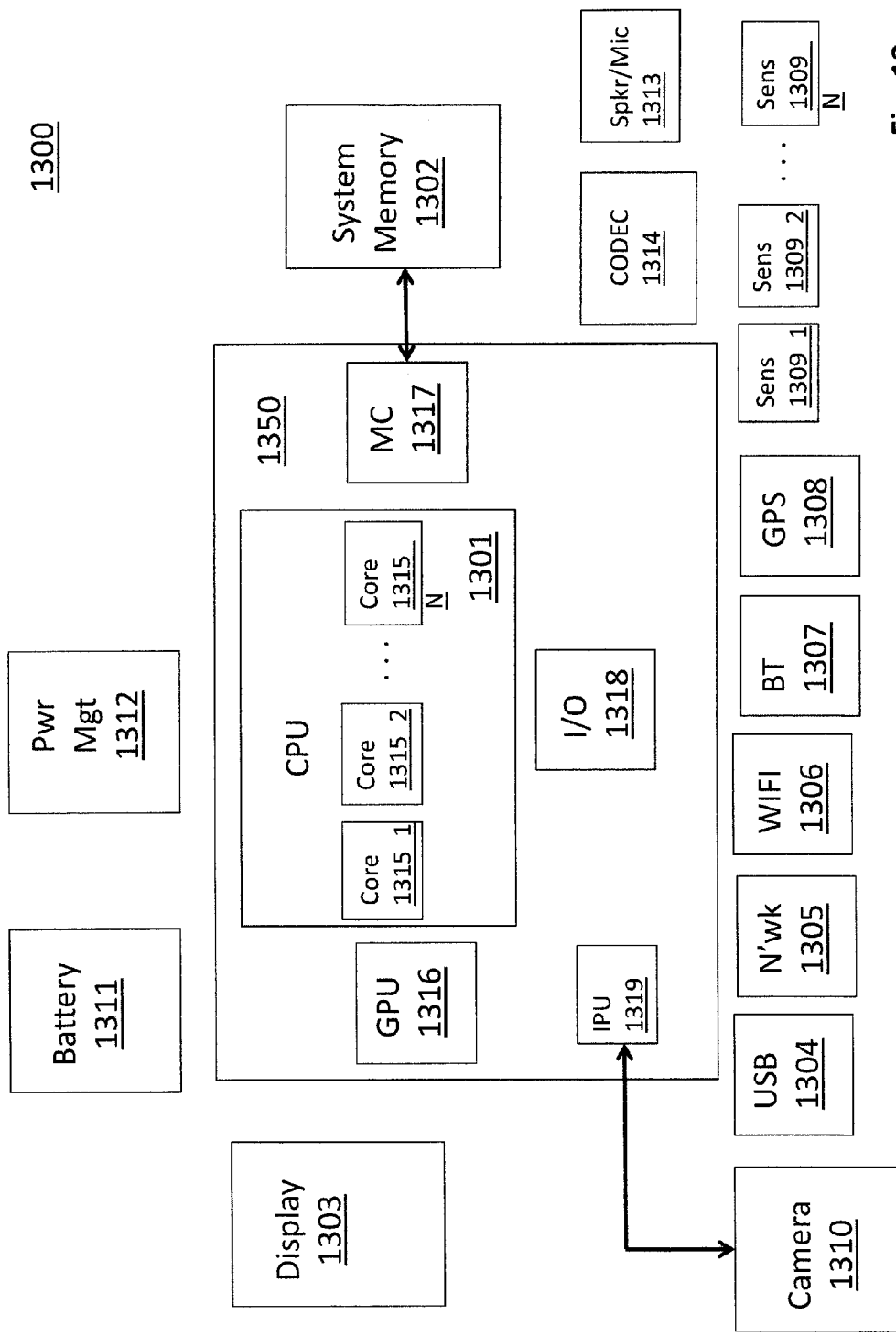
FIG. 13 shows an embodiment of a computing system.

FIG. 13 provides an exemplary depiction of a computing system. Many of the components of the computing system described below are applicable to a computing system having an integrated camera and associated image processor (e.g., a handheld device such as a smartphone or tablet computer). Those of ordinary skill will be able to easily delineate between the two.

As observed in FIG. 13, the basic computing system may include a central processing unit 1301 (which may include, e.g., a plurality of general purpose processing cores 1315_1 through 1315_N and a main memory controller 1317 disposed on a multi-core processor or applications processor), system memory 1302, a display 1303 (e.g., touchscreen, flat-panel), a local wired point-to-point link (e.g., USB) interface 1304, various network I/O functions 1305 (such as an Ethernet interface and/or cellular modem subsystem), a wireless local area network (e.g., WiFi) interface 1306, a wireless point-to-point link (e.g., Bluetooth) interface 1307 and a Global Positioning System interface 1308, various sensors 1309_1 through 1309_N, one or more cameras 1310, a battery 1311, a power management control unit 1324, a speaker and microphone 1313 and an audio coder/decoder 1314.

An applications processor or multi-core processor 1350 may include one or more general purpose processing cores 1315 within its CPU 1301, one or more graphical processing units 1316, a memory management function 1317 (e.g., a memory controller), an I/O control function 1318 and an image processing unit 1319. The general purpose processing cores 1315 typically execute the operating system and application software of the computing system. The graphics processing units 1316 typically execute graphics intensive functions to, e.g., generate graphics information that is presented on the display 1303. The memory control function 1317 interfaces with the system memory 1302 to write/read data to/from system memory 1302. The power management control unit 1324 generally controls the power consumption of the system 1300.

The image processing unit 1319 may be implemented according to any of the image processing unit embodiments described at length above in the preceding sections. Alternatively or in combination, the IPU 1319 may be coupled to either or both of the GPU 1316 and CPU 1301 as a co-processor thereof. Additionally, in various embodiments, the GPU 1316 may be implemented with any of the image processor features described at length above.

Each of the touchscreen display 1303, the communication interfaces 1304-1307, the GPS interface 1308, the sensors 1309, the camera 1310, and the speaker/microphone codec 1313, 1314 all can be viewed as various forms of I/O (input and/or output) relative to the overall computing system including, where appropriate, an integrated peripheral device as well (e.g., the one or more cameras 1310). Depending on implementation, various ones of these I/O components may be integrated on the applications processor/multi-core processor 1350 or may be located off the die or outside the package of the applications processor/multi-core processor 1350.

In an embodiment one or more cameras 1310 includes a depth camera capable of measuring depth between the camera and an object in its field of view. Application software, operating system software, device driver software and/or firmware executing on a general purpose CPU core (or other functional block having an instruction execution pipeline to execute program code) of an applications processor or other processor may perform any of the functions described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. One or more non-transitory computer storage media encoded with program code that when processed by a computing system causes the computing system to perform operations comprising:

instantiating, within an application software development environment, an input array, an output array, and a plurality of virtual processor instances, wherein the input array stores input image data of one or more line groups of an image, and wherein the output array stores output image data of one or more line groups of the image, wherein each virtual processor instance comprises one or more registers, each virtual processor instance being configured to execute instructions of an instruction set architecture having a load instruction that references locations within the input array of the application software development environment, and wherein each virtual processor instance is configured to execute a respective thread of a plurality of threads, wherein each thread is assigned to a respective line group position within a line group of the image;

receiving a load instruction of the instruction set architecture of the virtual processor instances, wherein the load instruction identifies a target register and specifies a load address having a source x offset and a source y offset, the source x offset and the source y offset being offsets relative to a line group position to which a thread executed by a virtual processor instance is assigned;

executing a respective thread having the load instruction by each virtual processor instance of the plurality of virtual processor instances thereby simulating operations of an image processor having a two-dimensional shift register array and a two-dimensional array of processing elements, wherein executing the load instruction includes performing operations comprising:

obtaining a line group position to which a thread executed by the virtual processor instance is assigned, computing a two-dimensional source position in the line group of the image including using the source x offset and the source y offset of the load address as offsets relative to the line group position to which the thread executed by the virtual processor instance is assigned, and copying, to a target register of the virtual processor instance identified by the load instruction, data from a location in the input image array corresponding to the computed two-dimensional source position in the line group of the image.

2. The one or more computer storage media of claim 1, wherein executing the load instruction by each virtual processor instance of the plurality of virtual processor instances comprises concurrently executing the load instruction by each virtual processor instance of the plurality of virtual processor instances.

3. The one or more computer storage media of claim 1, wherein instantiating, within the application software development environment, a plurality of virtual processor instances comprises:

instantiating at least one virtual processor instance for each location in the output image array; and assigning respective threads executed by the plurality of virtual processor instances to respective line group positions corresponding respectively to locations of image data in the output image array.

4. The one or more computer storage media of claim 1, wherein executing a same load instruction by the plurality of virtual processor instances causes each virtual processor instance to read from a different respective location in the input image array.

5. The one or more computer storage media of claim 1, wherein the operations further comprise:

receiving a store instruction of the instruction set architecture of the virtual processor instances, wherein the store instruction identifies a source register and specifies a store address, the store address having a target x offset and a target y offset, the target x offset and the target y offset being offsets relative to a line group position to which a thread executed by a virtual processor instance is assigned; and executing the store instruction by each virtual processor instance, including:

obtaining a line group position to which a thread executed by the virtual processor instance is assigned, computing a two-dimensional target position in the line group of the image including using the target x offset and the target y offset of the store address as offsets relative to the line group position to which the thread executed by the virtual processor instance is assigned, and copying, to a location in the output image array corresponding to the computed two-dimensional target position in the line group of the image, data from a source register of the virtual processor instance identified by the store instruction.

6. The one or more computer storage media of claim 5, wherein executing a same store instruction by the plurality of virtual processor instances causes each virtual processor instance to write to a different respective location in the output image array.

7. The one or more computer storage media of claim 5, wherein after executing the store instruction by each virtual processor instance of the plurality of virtual processor instances, the input image array remains unchanged.

8. A system comprising:

one or more computers and one or more storage devices storing instructions that are operable, when executed by the one or more computers, to cause the one or more computers to perform operations comprising:

instantiating, within an application software development environment, an input array, an output array, and a plurality of virtual processor instances, wherein the input array stores input image data of one or more line groups of an image, and wherein the output array stores output image data of one or more line groups of the image, wherein each virtual processor instance comprises one or more registers, each virtual processor instance being configured to execute instructions of an instruction set architecture having a load instruction that references locations within the input array of the application software development environment, and wherein each virtual processor instance is configured to execute a respective thread of a plurality of threads, wherein each thread is assigned to a respective line group position within a line group of the image;

receiving a load instruction of the instruction set architecture of the virtual processor instances, wherein the load instruction identifies a target register and specifies a load address having a source x offset and a source y offset, the source x offset and the source y offset being offsets relative to a line group position to which a thread executed by a virtual processor instance is assigned;

executing a respective thread having the load instruction by each virtual processor instance of the plurality of virtual processor instances thereby simulating operations of an image processor having a two-dimensional shift register array and a two-dimensional array of processing elements, wherein executing the load instruction includes:

obtaining a line group position to which a thread executed by the virtual processor instance is assigned, computing a two-dimensional source position in the line group of the image including using the source x offset and the source y offset of the load address as offsets relative to the line group position to which the thread executed by the virtual processor instance is assigned, and copying, to a target register of the virtual processor instance identified by the load instruction, data from a location in the input image array corresponding to the computed two-dimensional source position in the line group of the image.

9. The system of claim 8, wherein executing the load instruction by each virtual processor instance of the plurality of virtual processor instances comprises concurrently executing the load instruction by each virtual processor instance of the plurality of virtual processor instances.

10. The system of claim 8, wherein instantiating, within the application software development environment, a plurality of virtual processor instances comprises:

instantiating at least one virtual processor instance for each location in the output image array; and assigning respective threads executed by the plurality of virtual processor instances to respective line group positions corresponding respectively to locations of image data in the output image array.

11. The system of claim 8, wherein executing a same load instruction by the plurality of virtual processor instances causes each virtual processor instance to read from a different respective location in the input image array.

12. The system of claim 8, wherein after executing the store instruction by each virtual processor instance of the plurality of virtual processor instances, the input image array remains unchanged.

13. The system of claim 8, wherein the operations further comprise:
receiving a store instruction of the instruction set architecture of the virtual processor instances, wherein the store instruction identifies a source register and specifies a store address, the store address having a target x offset and a target y offset, the target x offset and the target y offset being offsets relative to a line group position to which a thread executed by a virtual processor instance is assigned; and
executing the store instruction by each virtual processor instance, including:
obtaining a line group position to which a thread executed by the virtual processor instance is assigned,
computing a two-dimensional target position in the line group of the image including using the target x offset and the target y offset of the store address as offsets relative to the line group position to which the thread executed by the virtual processor instance is assigned, and
copying, to a location in the output image array corresponding to the computed two-dimensional target position in the line group of the image, data from a source register of the virtual processor instance identified by the store instruction.

14. The system of claim 13, wherein executing a same store instruction by the plurality of virtual processor instances causes each virtual processor instance to write to a different respective location in the output image array.

15. The system of claim 13, wherein after executing the store instruction by each virtual processor instance of the plurality of virtual processor instances, the input image array remains unchanged.

16. A computer-implemented method comprising:
instantiating, within an application software development environment, an input array, an output array, and a plurality of virtual processor instances, wherein the input array stores input image data of one or more line groups of an image, and wherein the output array stores output image data of one or more line groups of the image, wherein each virtual processor instance comprises one or more registers, each virtual processor instance being configured to execute instructions of an instruction set architecture having a load instruction that references locations within the input array of the application software development environment, and wherein each virtual processor instance is configured to execute a respective thread of a plurality of threads, wherein each thread is assigned to a respective line group position within a line group of the image;
receiving a load instruction of the instruction set architecture of the virtual processor instances, wherein the load instruction identifies a target register and specifies a load address having a source x offset and a source y offset, the source x offset and the source y offset being offsets relative to a line group position to which a thread executed by a virtual processor instance is assigned;
executing a respective thread having the load instruction by each virtual processor instance of the plurality of virtual processor instances thereby simulating operations of an image processor having a two-dimensional shift register array and a two-dimensional array of processing elements, wherein executing the load instruction includes:
obtaining a line group position to which a thread executed by the virtual processor instance is assigned,
computing a two-dimensional source position in the line group of the image including using the source x offset and the source y offset of the load address as offsets relative to the line group position to which the thread executed by the virtual processor instance is assigned, and
copying, to a target register of the virtual processor instance identified by the load instruction, data from a location in the input image array corresponding to the computed two-dimensional source position in the line group of the image.

17. The method of claim 16, wherein the operations further comprise:
receiving a store instruction of the instruction set architecture of the virtual processor instances, wherein the store instruction identifies a source register and specifies a store address, the store address having a target x offset and a target y offset, the target x offset and the target y offset being offsets relative to a line group position to which a thread executed by a virtual processor instance is assigned; and
executing the store instruction by each virtual processor instance, including:
obtaining a line group position to which a thread executed by the virtual processor instance is assigned,
computing a two-dimensional target position in the line group of the image including using the target x offset and the target y offset of the store address as offsets relative to the line group position to which the thread executed by the virtual processor instance is assigned, and
copying, to a location in the output image array corresponding to the computed two-dimensional target position in the line group of the image, data from a source register of the virtual processor instance identified by the store instruction.

18. The method of claim 17, wherein executing a same store instruction by the plurality of virtual processor instances causes each virtual processor instance to write to a different respective location in the output image array.

19. One or more non-transitory computer storage media encoded with program code that when processed by a computing system causes the computing system to perform operations comprising:
instantiating, within an application software development environment, an input array, an output array, and a plurality of virtual processor instances, wherein the input array stores input image data of one or more line groups of an image, and wherein the output array stores output image data of one or more line groups of the image, wherein each virtual processor instance comprises one or more registers, each virtual processor instance being configured to execute instructions of an instruction set architecture having a store instruction that references locations within the output array of the application software development environment, and wherein each virtual processor instance is configured to execute a respective thread of a plurality of threads, wherein each thread is assigned to a respective line group position within a line group of the image;

receiving a store instruction of the instruction set architecture of the virtual processor instances, wherein the store instruction identifies a source register and specifies a store address, the store address having a target x offset and a target y offset, the target x offset and the target y offset being offsets relative to a line group position to which a thread executed by a virtual processor instance is assigned; and executing a respective thread having the store instruction by each virtual processor instance of the plurality of processor instances thereby simulating operations of an image processor having a two-dimensional shift register array and a two-dimensional array of processing elements, wherein executing the store instruction includes:
  obtaining a line group position to which a thread executed by the virtual processor instance is assigned,
  computing a two-dimensional target position in the line group of the image including using the target x offset and the target y offset of the store address as offsets relative to the line group position to which the thread executed by the virtual processor instance is assigned, and
  copying, to a location in the output image array corresponding to the computed two-dimensional target position in the line group of the image, data from a source register of the virtual processor instance identified by the store instruction.

20. A system comprising:

one or more computers and one or more storage devices storing instructions that are operable, when executed by the one or more computers, to cause the one or more computers to perform operations comprising:

instantiating, within an application software development environment, an input array, an output array, and a plurality of virtual processor instances, wherein the input array stores input image data of one or more line groups of an image, and wherein the output array stores output image data of one or more line groups of the image, wherein each virtual processor instance comprises one or more registers, each virtual processor instance being configured to execute instructions of an instruction set architecture having a store instruction that references locations within the output array of the application software development environment, and wherein each virtual processor instance is configured to execute a respective thread of a plurality of threads, wherein each thread is assigned to a respective line group position within a line group of the image;

receiving a store instruction of the instruction set architecture of the virtual processor instances, wherein the store instruction identifies a source register and specifies a store address, the store address having a target x offset and a target y offset, the target x offset and the target y offset being offsets relative to a line group position to which a thread executed by a virtual processor instance is assigned; and executing a respective thread having the store instruction by each virtual processor instance of the plurality of virtual processor instances thereby simulating operations of an image processor having a two-dimensional shift register array and a two-dimensional array of processing elements, wherein executing the store instruction includes:
  obtaining a line group position to which a thread executed by the virtual processor instance is assigned,
  computing a two-dimensional target position in the line group of the image including using the target x offset and the target y offset of the store address as offsets relative to the line group position to which the thread executed by the virtual processor instance is assigned, and
  copying, to a location in the output image array corresponding to the computed two-dimensional target position in the line group of the image, data from a source register of the virtual processor instance identified by the store instruction.

21. A computer-implemented method comprising:

instantiating, within an application software development environment, an input array, an output array, and a plurality of virtual processor instances, wherein the input array stores input image data of one or more line groups of an image, and wherein the output array stores output image data of one or more line groups of the image, wherein each virtual processor instance comprises one or more registers, each virtual processor instance being configured to execute instructions of an instruction set architecture having a store instruction that references locations within the output array of the application software development environment, and wherein each virtual processor instance is configured to execute a respective thread of a plurality of threads, wherein each thread is assigned to a respective line group position within a line group of the image;

receiving a store instruction of the instruction set architecture of the virtual processor instances, wherein the store instruction identifies a source register and specifies a store address, the store address having a target x offset and a target y offset, the target x offset and the target y offset being offsets relative to a line group position to which a thread executed by a virtual processor instance is assigned; and executing a respective thread having the store instruction by each virtual processor instance of the plurality of virtual processor instances thereby simulating operations of an image processor having a two-dimensional shift register array and a two-dimensional array of processing elements, wherein executing the store instruction includes:
  obtaining a line group position to which a thread executed by the virtual processor instance is assigned,
  computing a two-dimensional target position in the line group of the image including using the target x offset and the target y offset of the store address as offsets relative to the line group position to which the thread executed by the virtual processor instance is assigned, and
  copying, to a location in the output image array corresponding to the computed two-dimensional target position in the line group of the image, data from a source register of the virtual processor instance identified by the store instruction.

* * * * *